United States Patent
Hasegawa et al.

(10) Patent No.: US 12,362,723 B2
(45) Date of Patent: Jul. 15, 2025

(54) BULK WAVE RESONATOR AND BANDPASS FILTER

(71) Applicant: SIWARD TECHNOLOGY CO., LTD, Yonezawa (JP)

(72) Inventors: Hiroshi Hasegawa, Shimotsuke (JP); Masashi Iwata, Shimotsuke (JP); Takumi Ozaki, Shimotsuke (JP); Kiyoshi Nakamura, Sendai (JP)

(73) Assignee: SIWARD TECHNOLOGY CO., LTD, Yonezawa (JP)

( * ) Notice: Subject to any disclaimer, the term of this patent is extended or adjusted under 35 U.S.C. 154(b) by 377 days.

(21) Appl. No.: 17/913,806

(22) PCT Filed: Mar. 18, 2021

(86) PCT No.: PCT/JP2021/011051
§ 371 (c)(1),
(2) Date: Mar. 22, 2023

(87) PCT Pub. No.: WO2021/193345
PCT Pub. Date: Sep. 30, 2021

(65) Prior Publication Data
US 2023/0275563 A1 Aug. 31, 2023

(30) Foreign Application Priority Data
Mar. 24, 2020 (JP) .................. 2020-053005

(51) Int. Cl.
*H03H 9/13* (2006.01)
*H03H 9/02* (2006.01)
(Continued)

(52) U.S. Cl.
CPC ........ *H03H 9/133* (2013.01); *H03H 9/02015* (2013.01); *H03H 9/02086* (2013.01); *H03H 9/171* (2013.01); *H03H 9/568* (2013.01)

(58) Field of Classification Search
CPC ............... H03H 9/133; H03H 9/02015; H03H 9/02086; H03H 9/171; H03H 9/568; H03H 9/02228; H03H 9/175; H03H 9/02
(Continued)

(56) References Cited

U.S. PATENT DOCUMENTS

| 10,250,227 | B2 * | 4/2019 | Kando | ................. | H03H 9/6483 |
| 2009/0256650 | A1 * | 10/2009 | Cathelin | ................. | H03H 9/584 216/13 |
| 2013/0057360 | A1 * | 3/2013 | Meltaus | ................. | H03H 9/564 29/25.35 |

FOREIGN PATENT DOCUMENTS

| JP | 9-199980 A | 7/1997 |
| JP | 2010-136317 A | 6/2010 |

(Continued)

OTHER PUBLICATIONS

Office Action issued to Japanese counterpart application No. 2020053005 by the JPO on Dec. 14, 2020 and machine translation (9 pages).
(Continued)

*Primary Examiner* — Jorge L Salazar, Jr.
(74) *Attorney, Agent, or Firm* — HSML P.C.

(57) ABSTRACT

[PROBLEM TO BE SOLVED] To provide a bulk wave resonator having a high frequency passband.
[SOLUTION] A bulk wave resonator using a bulk wave, includes a support substrate, an acoustic multilayer film that includes, stacked on the support substrate, a plurality of types of dielectrics having different acoustic impedances, a piezoelectric layer that is stacked on the acoustic multilayer film, a first electrode, and a second electrode. The first and second electrodes are disposed to face each other with a gap therebetween on a first surface of the piezoelectric layer opposite to the acoustic multilayer film, and are applied with a voltage for allowing the piezoelectric layer to generate the bulk wave. A direction that is parallel to the surface of the
(Continued)

piezoelectric layer and in which the first electrode and the second electrode face each other is defined as a first direction. The bulk wave resonator uses, as a main mode, a bulk wave in the first direction that is generated by a thickness shear vibration in the first direction, which is excited by a parallel electric field formed in the piezoelectric layer when a voltage applied to the first electrode and the second electrode.

17 Claims, 28 Drawing Sheets

(51) Int. Cl.
*H03H 9/17* (2006.01)
*H03H 9/56* (2006.01)

(58) Field of Classification Search
USPC .................................. 333/187, 188, 193–196
See application file for complete search history.

(56) References Cited

FOREIGN PATENT DOCUMENTS

| | | |
|---|---|---|
| JP | 2010-161671 A | 7/2010 |
| JP | 5190841 B2 | 4/2013 |
| JP | 2013-123184 A | 6/2013 |
| JP | 2013-528996 A | 7/2013 |
| JP | 2015-502065 A | 1/2015 |
| WO | 2010/007805 A1 | 1/2010 |

OTHER PUBLICATIONS

Office Action issued to Japanese counterpart application No. 2020053005 by the JPO on Mar. 15, 2021 and machine translation (9 pages).
Search Report issued to PCT application No. PCT/JP2021/011051 on May 11, 2021 and English translation (6 pages).

* cited by examiner

BULK WAVE RESONATOR AND BANDPASS FILTER

FIELD OF THE INVENTION

The disclosure relates to a bulk wave resonator and a bandpass filter.

PRIOR ART

For example, Patent Document 1 discloses a structure of a bulk wave resonator (a film bulk acoustic resonator (FBAR)) in which a piezoelectric layer is interposed between an upper electrode and a lower electrode. In such bulk wave resonator, a cavity may be formed between the lower electrode and a support substrate.

PRIOR ART DOCUMENT

Patent Literature

PATENT DOCUMENT 1: Japanese Invention Pat. No. 5190841

SUMMARY OF INVENTION

Problem to be Solved by the Invention

As the frequency of wireless communication becomes higher, it is desirable to realize bandpass filters with a higher frequency passband. To realize such bandpass filter, a bulk wave resonator with a higher resonant frequency needs to be realized. For increasing the resonant frequency of the bulk wave resonator, the thickness of a piezoelectric layer should be reduced.

However, in a bulk wave resonator (FBAR) having a structure in which a piezoelectric layer is interposed between an upper electrode and a lower electrode, due to a cavity, at least a part of the piezoelectric layer has a thinned structure that is separated from a support substrate, so that the bulk wave resonator may not have a sufficient mechanical stability. This causes a difficulty in raising a resonance frequency.

Therefore, an object of the invention is to provide a bulk wave resonator and a bandpass filter having a high frequency passband.

Means for Solving Problem

In order to solve the aforesaid problem, according to one aspect of the invention, the invention provides a bulk wave resonator using a bulk wave, including:
a support substrate;
an acoustic multilayer film that includes, stacked on the support substrate, a plurality of types of dielectrics having different acoustic impedances;
a piezoelectric layer that is stacked on the acoustic multilayer film; and
a first electrode and a second electrode that are disposed to face each other with a gap therebetween on a first surface of the piezoelectric layer opposite to the acoustic multilayer film, and that are applied with a voltage for allowing the piezoelectric layer to generate the bulk wave,
a direction that is parallel to the surface of the piezoelectric layer and in which the first electrode and the second electrode face each other being defined as a first direction, the bulk wave resonator using, as a main mode, a bulk wave in the first direction that is generated by a thickness shear vibration in the first direction, which is excited by a parallel electric field when a voltage is applied to the first electrode and the second electrode.

The bulk wave resonator may be a solidity mounted resonator (SMR) type bulk wave resonator in which the piezoelectric layer is supported by the support substrate via the acoustic multilayer film, and no space is formed between the piezoelectric layer and the support substrate.

There may be no electrode disposed on a second surface of the piezoelectric layer that is located at the side of the acoustic multilayer film.

There may be a first load disposed on the first electrode and a second load disposed on the second electrode.

The first load may be disposed such that an end face of the first load that is opposite to the second electrode matches an end face of the first electrode that is opposite to the second electrode, and the second load may be disposed such that an end face of the second load that is opposite to the first electrode matches an end face of the second electrode that is opposite to the first electrode.

The bulk wave resonator may further include a first suppression electrode and a second suppression electrode that are disposed on the first surface of the piezoelectric layer and that are arranged to face each other in a second direction orthogonal to the first direction. The first suppression electrode and the second suppression electrode may be arranged to face each other in the second direction with a gap between the first electrode and the second electrode being interposed therebetween.

The first electrode and the second electrode may have no portions that overlap with each other in the first direction.

The first electrode and the second electrode do not configure an interdigital transducer (IDT) electrode.

The piezoelectric layer may be composed of a rotated Y-cut plate that is obtained by cutting a single crystal of a piezoelectric material along a plane, the plane being obtained by rotating, at least about an X-axis, a surface of the single crystal that is orthogonal to a Y-axis.

The piezoelectric layer may be composed of a rotated Y-cut plate that is obtained by cutting a single crystal of lithium tantalate along a plane, the plane being obtained by rotating, about an X-axis, a surface of the single crystal that is orthogonal to a Y-axis by an angle within a range between 80 degrees and 160 degrees, and further rotating, about a Z-axis, the rotated surface by an angle within a range between −35 degrees and 35 degrees.

The piezoelectric layer may be composed of a rotated Y-cut plate that is obtained by cutting a single crystal of lithium niobate along a plane, the plane being obtained by rotating, about an X-axis, a surface of the single crystal that is orthogonal to a Y-axis by an angle within a range between 60 degrees and 170 degrees, and further rotating, about a Z-axis, the rotated surface by an angle within a range between −35 degrees and 35 degrees.

According to another aspect of the invention, there is provided a bandpass filter that includes a plurality of bulk wave resonators.

The plurality of bulk wave resonators may be connected to each other in a ladder shape.

The plurality of bulk wave resonators may be connected to each other in a lattice shape.

Effect of the Invention

According to the present invention, a bulk wave resonator and the bandpass filter having a high frequency passband can be provided.

EMBODIMENTS FOR CARRYING OUT THIS INVENTION

Figure 1:
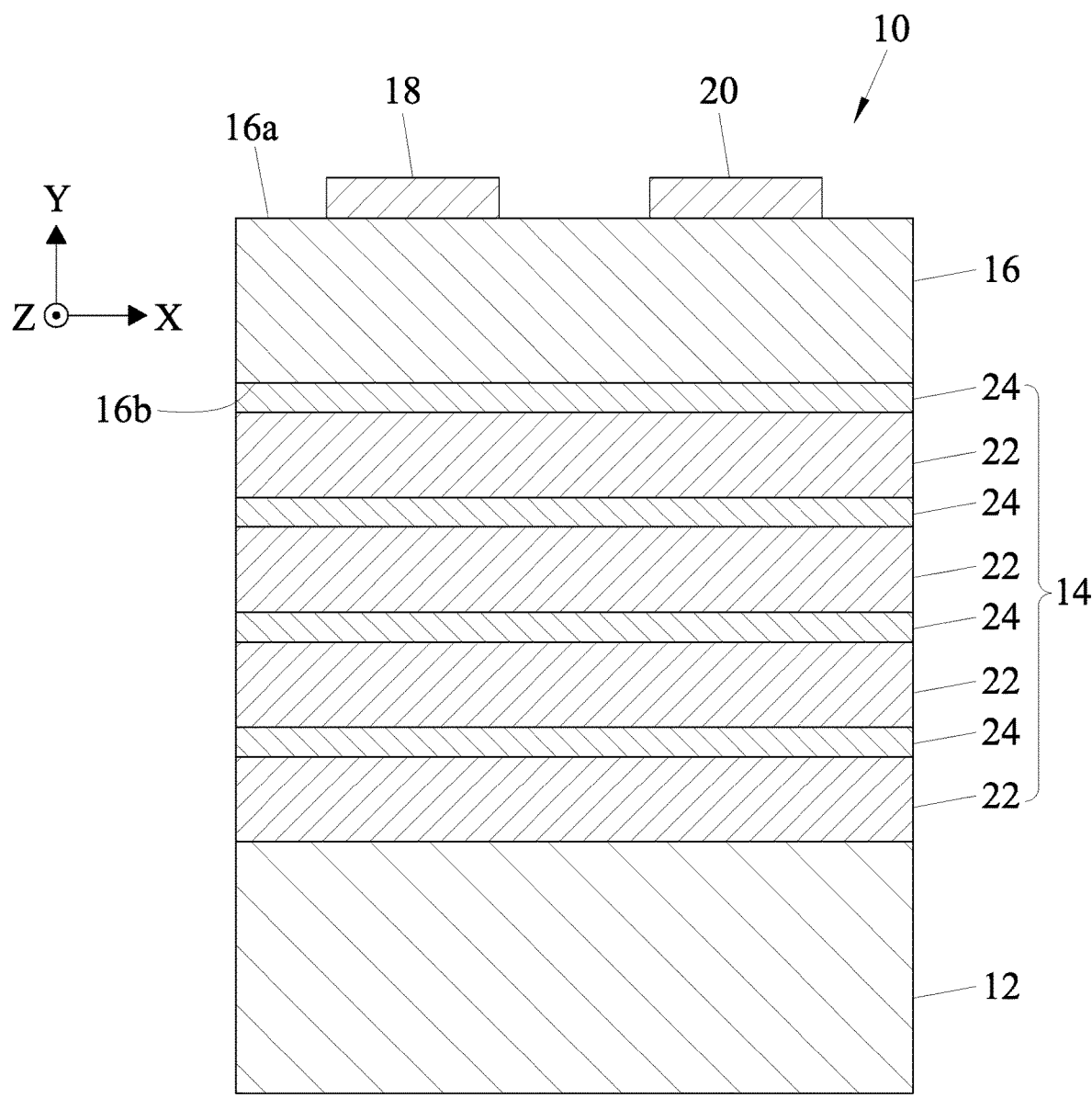
FIG. 1 is a schematic cross-sectional view illustrating configuration of a bulk wave resonator of a first embodiment according to the invention.

The embodiments of the present disclosure will be described in detail below with reference to the figures. Specific dimensions, materials, and other numerical values shown in the embodiments are merely examples to facilitate understanding of the invention, and are not intended to limit the invention, unless otherwise specifically stated. In this specification and the drawings, components with substantially the same functions and configurations are denoted by the same reference numerals, and redundant explanations for these components are omitted. Besides, elements that are not directly related to the present invention are omitted from the figures.

First Embodiment

Figure 2:
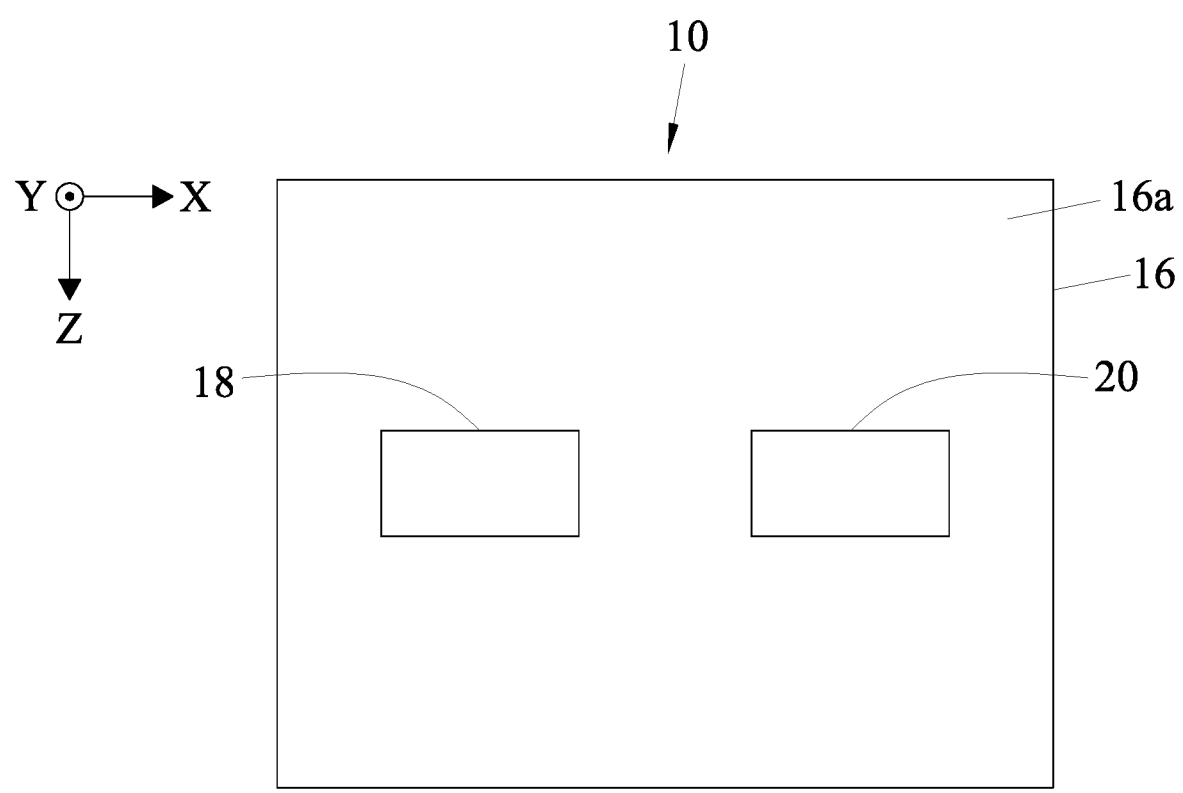
FIG. 2 is a schematic plan view illustrating the first embodiment of the bulk wave resonator.

FIG. 1 is a schematic cross-sectional view illustrating structure of a bulk wave resonator 10 of a first embodiment according to the invention. FIG. 2 is a schematic plan view illustrating the bulk wave resonator 10 of the embodiment. The bulk wave resonator 10 includes a support substrate 12, an acoustic multilayer film 14, a piezoelectric layer 16, a first electrode 18, and a second electrode 20. The bulk wave resonator 10 is configured in a way that the acoustic multilayer film 14 is stacked on the support substrate 12; the piezoelectric layer 16 is stacked on the acoustic multilayer film 14; and the first electrode 18 and the second electrode 20 are disposed on the piezoelectric layer 16.

The support substrate 12 is formed into flat-plate-shaped. The support substrate 12 supports the acoustic multilayer film 14, the piezoelectric layer 16, and the first electrode 18 and the second electrode 20. The support substrate 12 is formed, for example, by a single crystal of silicon (Si). The material of forming the support substrate is not limited to a single crystal of silicon, as long as it can properly support the piezoelectric layer 16.

The acoustic multilayer film 14 is stacked on the support substrate 12. The acoustic multilayer film 14 is composed of a plurality of types of stacked alternately dielectrics with different acoustic impedances.

The acoustic multilayer film 14 includes a first dielectric layer 22 and a second dielectric layer 24. The first dielectric layer 22 and the second dielectric layer 24 are stacked alternately in such order along a direction from the support substrate 12 toward the piezoelectric layer 16 to form the acoustic multilayer film 14. In the example shown in FIG. 1, there are four of the first dielectric layers 22 and four of the second dielectric layers 24 that are stacked alternately. In addition, the number of the first dielectric layer 22 and the second dielectric layer 24 is not limited to four, but may be at least one. Moreover, the acoustic multilayer film 14 is not limited to including two types of alternately stacked dielectrics (the first dielectric layers 22 and the second dielectric layers 24), but may include three or more types of dielectrics stacked one on another.

The lowermost one of the first dielectric layers 22 of the acoustic multilayer film 14 has a bottom surface being in contact with an upper surface of the support substrate 12. The uppermost one of the second dielectric layers 24 of the acoustic multilayer film 14 has an upper surface being in contact with the piezoelectric layer 16. The acoustic impedance of each second dielectric layer 24 is different from the acoustic impedance of each first dielectric layer 22 and the piezoelectric layer 16.

The piezoelectric layer 16 is stacked on the uppermost one of the second dielectric layers 24 of the acoustic multilayer film 14. The piezoelectric layer 16 is made of a piezoelectric material formed into a thin film.

The piezoelectric layer 16 is made of, for example, a single crystal of lithium tantalate ($LiTaO_3$) or a single crystal of lithium niobate ($LiNbO_3$). Thus, the piezoelectric layer 16 is a single-crystal type piezoelectric layer and not a thin-film type piezoelectric layer. The piezoelectric layer 16 may also be made of a single crystal of lithium tantalate or a single crystal of lithium niobate which has undergone at least one of pyroelectric, Fe-doping, or Mg-doping treatment. Furthermore, the piezoelectric layer 16 is not limited to being made of lithium tantalate or lithium niobate, but can also be made of other piezoelectric material, such as aluminum nitride (AlN), zinc oxide (ZnO), quartz, piezoelectric material with tilted C-axis, etc.

The piezoelectric layer 16 has an upper surface 16a (a first surface) and a lower surface 16b (a second surface). The upper surface 16a and the lower surface 16b are the main surfaces of the piezoelectric layer 16 and are substantially planar. Of the two surfaces (the upper surface 16a and the lower surface 16b) of the piezoelectric layer 16, the lower surface 16b is in contact with the acoustic multilayer film 14 (specifically, the second dielectric layer 24). In other words, the lower surface 16b of the piezoelectric layer 16 is a surface that faces the acoustic multilayer film 14, and the upper surface 16a of the piezoelectric layer 16 is a surface that is opposite to the acoustic multilayer film 14. The upper surface 16a of the piezoelectric layer 16 corresponds to the first surface, which is a surface of the piezoelectric layer 16 that is opposite to the acoustic multilayer 14. The lower surface 16b of the piezoelectric layer 16 corresponds to the second surface, which is a surface of the piezoelectric layer 16 that faces the acoustic multilayer film 14.

The first electrode 18 and the second electrode 20 are disposed on the upper surface 16a of the piezoelectric layer 16. In other words, the first electrode 18 and the second electrode 20 are located on the first surface (i.e., the upper surface 16a) of the piezoelectric layer 16 that is opposite to the acoustic multilayer film 14. Each of the first electrode 18 and the second electrode 20 is in contact with the piezoelectric layer 16. The first electrode 18 and the second electrode 20 are disposed opposite to each other with a gap therebetween. Each of the first electrode 18 and the second electrode 20 is formed, for example, into a rectangular flat plate shape, and a side of the first electrode 18 and a side of the second electrode 20 face each other.

Hereinafter, in the bulk wave resonator 10, a direction in which the first electrode 18 and the second electrode 20 face each other may sometimes be referred to as X-direction. In addition, a thickness direction of the piezoelectric layer 16 may sometimes be referred to as Y-direction. Moreover, a direction perpendicular to both the X-direction and the Y-direction may sometimes be referred to as Z-direction. The X-direction corresponds to a first direction which is a direction parallel to the first surface of the piezoelectric layer 16 and in which the first electrode 18 and the second electrode 20 face each other. The Z-direction corresponds to a second direction which is a direction parallel to the first surface of the piezoelectric layer 16 and orthogonal to the first direction.

For example, the first electrode 18 and the second electrode 20 may be formed to have a lower layer that is in contact with the piezoelectric layer 16 and an upper layer that is stacked on the lower layer. The upper layers of the first electrode 18 and the second electrode 20 may be formed of gold (Au), which has a relatively high electrical conductivity. The lower layers of the first electrode 18 and the second electrode 20 may be formed of, e.g., titanium (Ti), and may serve as a buffer for properly securing the upper layer to the piezoelectric layer 16. Moreover, the materials of the first electrode 18 and the second electrode 20 are not limited to gold and titanium, but may be any electrically conductive materials.

In the bulk wave resonator 10, the first electrode 18 and the second electrode 20 are formed only on the surface of the piezoelectric layer 16 that is opposite to the acoustic multilayer 14 (i.e., the upper surface 16a), and no electrode is formed on the surface of the piezoelectric layer 16 that faces the acoustic multilayer film 14 (i.e., the lower surface 16b).

A voltage is applied between the first electrode 18 and the second electrode 20. When a voltage is applied between the first electrode 18 and the second electrode 20, the piezoelectric layer 16 is subjected to the voltage, so a parallel electric field thickness shear vibration will be generated in the piezoelectric layer 16.

Figure 3:
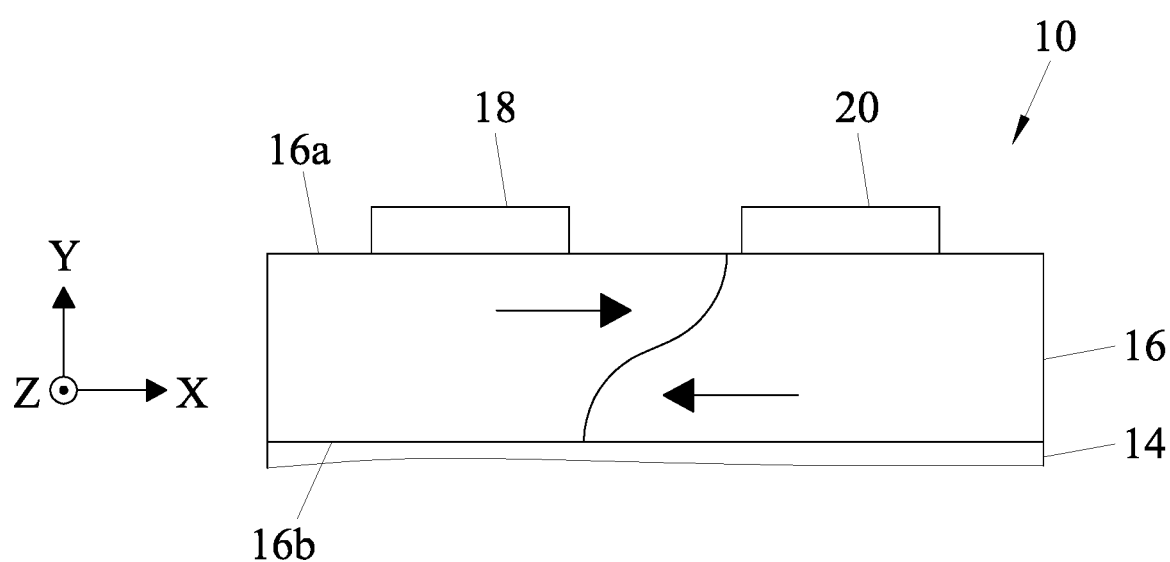
FIG. 3 is a schematic view for illustrating a thickness shear vibration of the bulk wave resonator excited by a parallel electric field in the first embodiment.

FIG. 3 shows a schematic view for illustrating a thickness shear vibration of the bulk wave resonator 10 excited by a parallel electric field in the first embodiment. In FIG. 3, a cross-section near the piezoelectric layer 16 is shown. As described above, for the bulk wave resonator 10, the first electrode 18 and the second electrode 20 are disposed on the same surface. When a voltage is applied between the first electrode 18 and the second electrode 20, the direction of the electric field applied to the piezoelectric layer 16 will be substantially the same as the X-direction. In other words, a parallel electric field excitation is generated in the piezoelectric layer 16, where the excitation direction of the electric field is parallel to the upper surface (the main surface) of the piezoelectric layer 16. The parallel electric field excitation in the X-direction generates a TS mode thickness shear vibration (i.e., the thickness shear vibration excited by the parallel electric field) of the piezoelectric layer 16, which vibrates in the X-direction.

When the thickness shear vibration is generated, a TS mode bulk wave (bulk acoustic wave, BAW) is generated in the piezoelectric layer 16. The bulk wave resonator 10 is a resonator that uses the TS mode bulk wave generated in the piezoelectric layer 16. In other words, the bulk wave resonator 10 is configured to generate the thickness shear vibration in the piezoelectric layer 16, which is excited by the parallel electric field excitation in the X-direction upon an application of a voltage to the first electrode 18 and the second electrode 20, and uses a bulk wave in the X-direction, which is generated by the thickness shear vibration, as a main mode. In this way, the main mode of the bulk wave resonator 10 according to the present embodiment is the thickness shear vibration (TS mode) generated by the parallel electric field excitation in the X-direction, and is not a thickness extensional vibration (TE mode) generated by a vertical electric field excitation in the Y-direction. In contrast, the main mode of the conventional FBAR is a thickness extensional vibration (TE mode) generated by a vertical electric field excitation in the Y-direction. In addition, the main mode of the conventional SAW (Surface Acoustic Wave) is a surface elastic wave propagating on a surface of a piezoelectric layer. Thus, the difference between the bulk wave resonator 10 of the embodiment and a conventional FBAR or SAW resides the direction and characteristics of the main mode of vibration.

Figure 4:
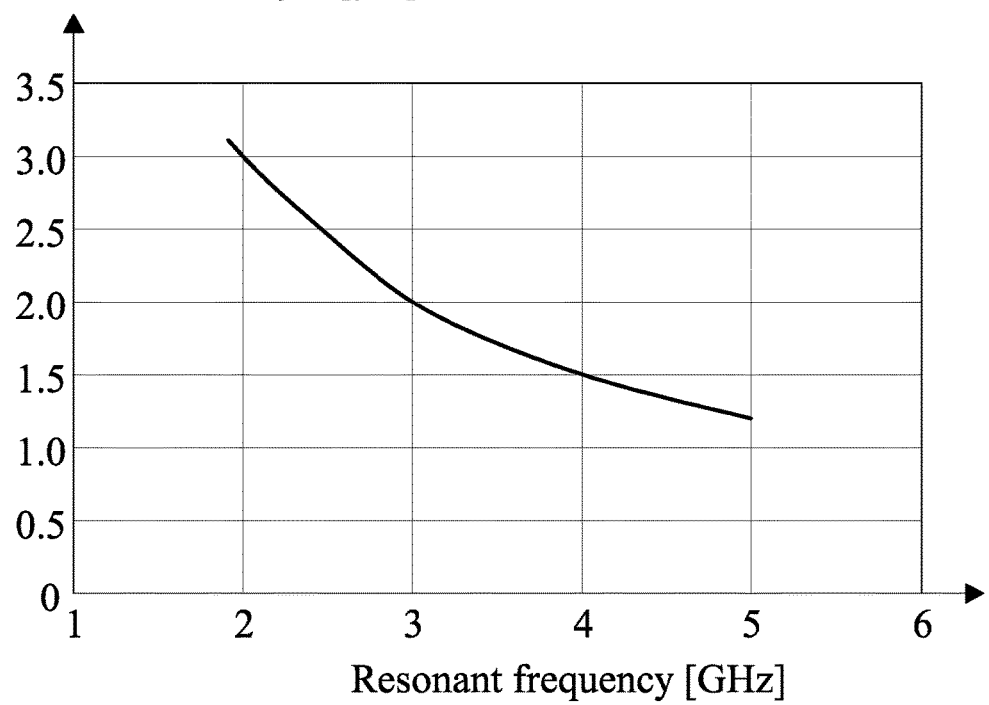
FIG. 4 is a graph illustrating a relationship between the resonant frequency of the bulk wave resonator and the thickness of the piezoelectric layer in the first embodiment.

FIG. 4 shows a graph illustrating an example of a relationship between the resonant frequency of the bulk wave resonator 10 and the thickness of the piezoelectric layer 16 in the first embodiment. The resonant frequency of the bulk wave resonator 10 corresponds to a frequency of the voltage between the first electrode 18 and the second electrode 20 when the impedance between the first electrode 18 and the second electrode 20 drops steeply. As shown in FIG. 4, the resonant frequency of the bulk wave resonator 10 can be increased by reducing thickness of the piezoelectric layer 16.

Referring back to FIG. 1, specific examples of the first dielectric layers 22 and the second dielectric layers 24 of the acoustic multilayer film 14 are shown. Each first dielectric layer 22 has an acoustic impedance higher than that of each second dielectric layer 24. In other words, each second dielectric layer 24 has an acoustic impedance lower than that of each first dielectric layer 22. Besides, each second dielectric layer 24 has an acoustic impedance lower than that of the piezoelectric layer 16. Thus, the difference in acoustic impedance between the first dielectric layers 22 and the second dielectric layers 24 is not lower than a predetermined value. In addition, the difference in acoustic impedance between the second dielectric layers 24 and the piezoelectric layer 16 is also not lower than a predetermined value.

The first dielectric layers 22 and the second dielectric layers 24 of the acoustic multilayer film 14 form an acoustic Bragg reflector in which the acoustic impedance alternates between high and low from layer to layer. Therefore, the bulk waves of the piezoelectric layer 16 will be reflected toward the piezoelectric layer 16 at an interface between the layers of the acoustic multilayer film 14 and at an interface between the piezoelectric layer 16 and the acoustic multilayer film 14.

As an example, the first dielectric layers 22 may be made of aluminum nitride (AlN) or alumina ($Al_2O_3$), and the second dielectric layers 24 may be made of silica ($SiO_2$). Moreover, materials of the first dielectric layers 22 and the second dielectric layers 24 are not limited to above-stated examples, and may be any materials which have appropriate acoustic impedance.

Each of the first dielectric layers 22 may have a thickness (layer thickness) that is one-fourth of the length (wavelength $\lambda$) of the bulk wave (sound wave) generated in the first dielectric layer 22 (i.e., in the material forming the first dielectric layer 22). Similarly, each of the second dielectric layers 24 may have a thickness (layer thickness) that is one-fourth of the length (wavelength $\lambda$) of the bulk wave (sound wave) generated in the second dielectric layer 24 (i.e., in the material forming the second dielectric layer 24). The wavelength $\lambda$ is related to a resonant frequency f0 of the bulk wave resonator 10. Therefore, the thicknesses of the first dielectric layers 22 and the second dielectric layers 24 may be set suitably according to the desired resonant frequency f0 of the bulk wave resonator 10.

As described above, in the bulk wave resonator 10 of the first embodiment, the acoustic multilayer film 14 is stacked on the support substrate 12, and the piezoelectric layer 16 is stacked on the acoustic multilayer film 14. In other words, the bulk wave resonator 10 of the first embodiment is a solidly mounted resonator (SMR) type bulk wave resonator in which the piezoelectric layer 16 is entirely supported by the support substrate 12 via the acoustic multilayer film 14 so that no cavity (space) is formed between the piezoelectric layer 16 and the support substrate 12. Therefore, according to the bulk wave resonator 10 of the first embodiment, the piezoelectric layer 16 can be securely supported by the acoustic multilayer film 14 and the support substrate 12. As a result, compared to a comparative example of a bulk wave resonator (FBAR) in which the piezoelectric layer 16 is sandwiched between an upper electrode and a lower electrode, according to the bulk wave resonator 10 of the first embodiment, the piezoelectric layer 16 can be prevented from being damaged even if the piezoelectric layer 16 has a reduced thickness.

As such, according to the bulk wave resonator 10 of the first embodiment, the piezoelectric layer 16 can be made thinner while being prevented from being damaged, thus achieving higher resonance frequency.

In the bulk wave resonator 10 of the first embodiment, the piezoelectric layer 16 is stacked on the acoustic multilayer film 14. Therefore, in the bulk wave resonator 10 of the first embodiment, the piezoelectric layer 16 can be acoustically separated from the support substrate 12, thereby suppressing energy loss.

Besides, the bulk wave resonator 10 of the first embodiment includes two electrodes (the first electrode 18 and the second electrode 20) disposed on the surface (the upper surface 16a) of the piezoelectric layer 16 that is opposite to the acoustic multilayer film 14. That is, in the bulk wave resonator 10 of the first embodiment, no electrode is disposed on the surface (the lower surface 16b) of the piezoelectric layer 16 that faces the acoustic multilayer film 14. Therefore, according to the bulk wave resonator 10 of the first embodiment, as compared to the comparative example of the bulk wave resonator, a process of disposing an electrode (so called "lower electrode") between the piezoelectric layer 16 and the support substrate 12 can be omitted, thereby simplifying the fabrication of the bulk wave resonator 10.

Second Embodiment

A bulk wave resonator of a second embodiment according to the disclosure will be described below. In the second embodiment, a range of a cut angle of a rotated Y-cut plate of a piezoelectric crystal that can be used as the piezoelectric layer 16 of the bulk wave resonator 10 of the first embodiment will be defined in detail.

Figure 5:
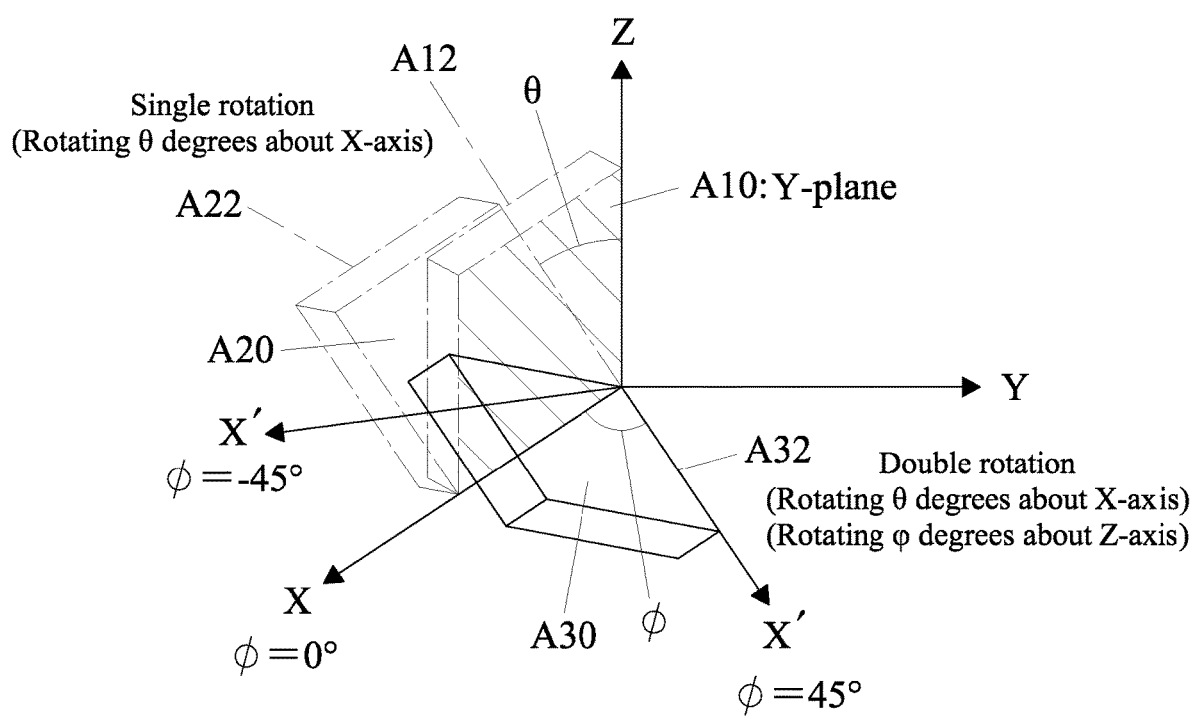
FIG. 5 is a schematic diagram for illustrating a definition of a cut angle of a rotated Y-cut plate.

FIG. 5 is a graph that illustrates the definition of the cut angle of the rotated Y-cut plate. X, Y, and Z illustrated in FIG. 5 correspond to the X-axis, Y-axis, and Z-axis of the crystal, respectively. A plane formed by the X-axis and Z-axis is defined as a Y-plane A10. In FIG. 5, the dash dot line A12 indicates a hypothetical flat plate along the Y-plane A10.

The cut angle of the rotated Y-cut plate indicates an angle by which the posture of the Y-plane A10 is rotated. The angle θ of the rotated Y-cut plate is an angle about the X-axis. A forward direction of the angle θ is defined as the rotation direction of a right-hand screw when the right-hand screw advances toward the positive direction of the X-axis. The angle φ of the rotated Y-cut plate is an angle about the Z-axis. A forward direction of the angle φ is defined as the rotation direction of a right-hand screw, when the right-hand screw advances toward the positive direction of the Z-axis.

In FIG. 5, a flat plate obtained by rotating the flat plate indicated by the dash dot line A12 by an arbitrary angle (θ degrees) about the X-axis is shown as an example with a dash double-dot line A22. That is, a plane A20 indicated by the dash double-dot line A22 corresponds to the Y-plane A10 after being rotated by the arbitrary angle (θ degrees) about the X-axis. Hereinafter, such rotation of Y-plane A10 in one direction (θ-direction) is referred as "single-rotation."

In addition, in FIG. 5, a flat plate obtained by rotating the flat plate indicated by the dash double-dot line A22 by an arbitrary angle (φ degrees) (e.g., φ=45) about the Z-axis is shown with a solid line A32. That is, a plane A30 indicated by the solid line A32 corresponds to the plane indicated by the dash double-dot line A22 after being rotated by the arbitrary angle (φ degrees) about the X-axis. In other words, the plane A30 corresponds to the Y-plane A10 after being rotated by θ degrees about the X-axis and φ degrees about the Z-axis. Hereinafter, such rotation of the Y-plane A10 in two directions (θ- and φ-directions) is referred as "double-rotation."

For example, when assuming that the angle θ and the angle φ of the rotated Y-cut plate are set so that a plane corresponding to the Y-plane A10 becomes the plane A30, the crystal will be cut in a plane parallel to the plane A30. Accordingly, the crystal cut in the plane parallel to the plane A30 will be used as the piezoelectric layer 16, so that the surface parallel to the plane A30 corresponds to a surface of the piezoelectric layer 16.

Figure 6:
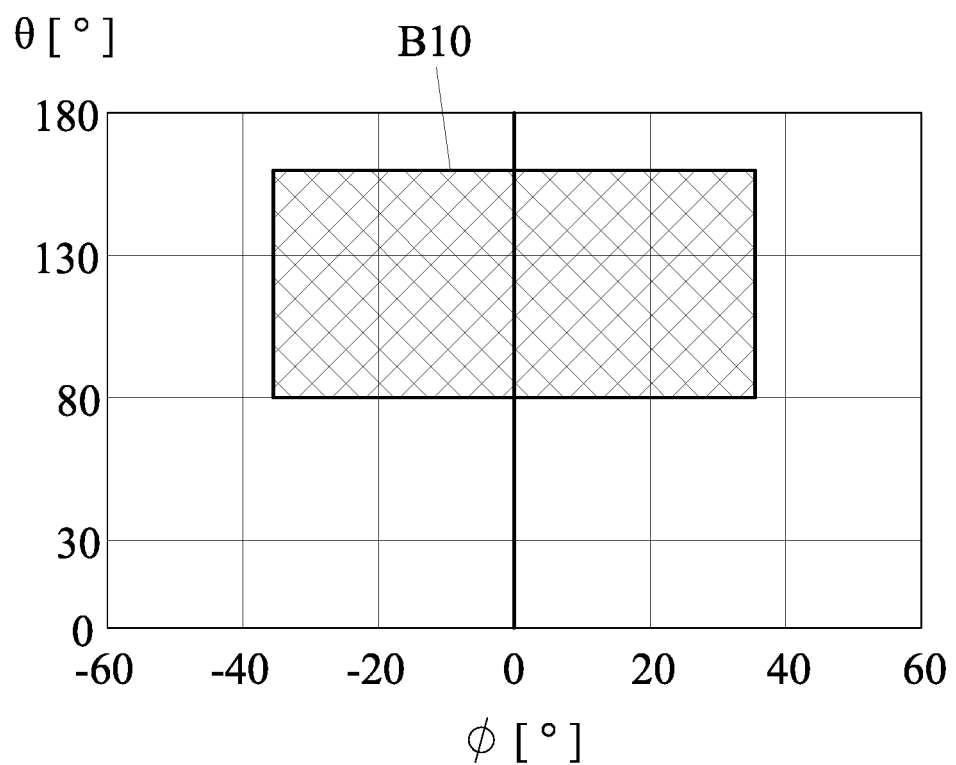
FIG. 6 illustrates a graph of a setting range of the cut angle of the rotated Y-cut plate when lithium tantalate is applied to the piezoelectric layer.

FIG. 6 illustrates a graph of a setting range of the cut angle of the rotated Y-cut plate when lithium tantalate is applied to the piezoelectric layer 16. Lithium tantalate is hereinafter abbreviated as LT.

When LT is applied to the piezoelectric layer 16, the angle θ of the rotated Y-cut plate of a single crystal of LT about the X-axis is set within a range between 80 degrees and 160 degrees, and the angle φ of the rotated Y-cut plate of the single crystal of LT about the Z-axis is set within a range between −35 degrees and 35 degrees. That is, the cut angle of the rotated Y-cut plate of LT is set to any value within a range indicated by a cross-hatching B10 in FIG. 6.

Figure 7:
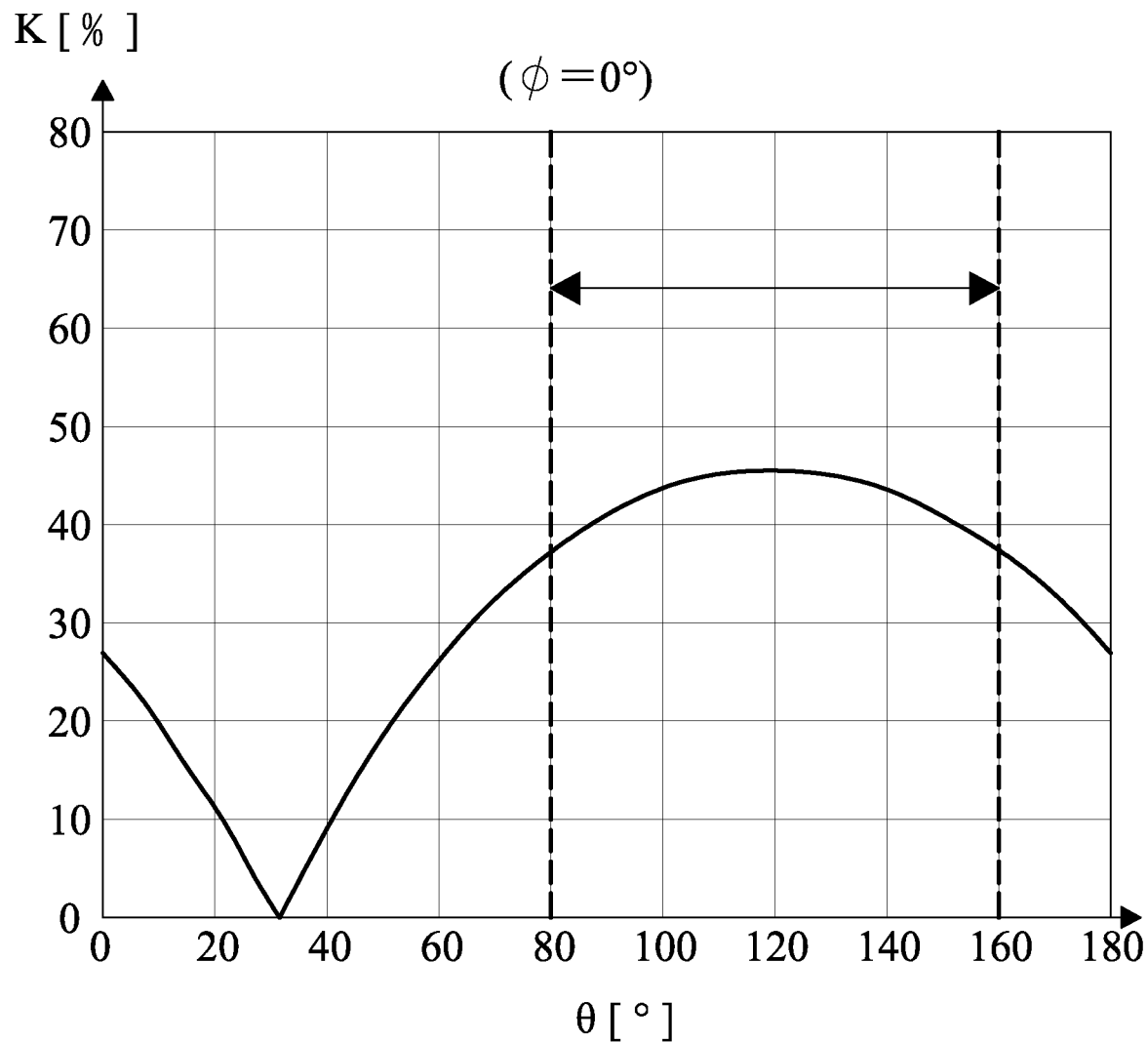
FIG. 7 shows a graph of a relationship between an angle $\theta$ of the rotated Y-cut plate of LT and the electromechanical coupling coefficient K of an X-direction propagation of the thickness shear vibration excited by parallel electric field.

FIG. 7 shows a relationship between the angle θ of the rotated Y-cut plate of LT and the electromechanical coupling coefficient K of an X-direction propagation of the thickness shear vibration excited by the parallel electric field. In FIG. 7, the angle φ is assumed to be zero. The electromechanical coupling coefficient K indicates the efficiency with which electrical energy provided to the piezoelectric layer 16 is converted into mechanical energy.

As shown in FIG. 7, the electromechanical coupling coefficient K can be set to be approximately 38% or more by setting the angle θ within a range between 80 degrees and 160 degrees (80 degrees-160 degrees).

Figure 8:
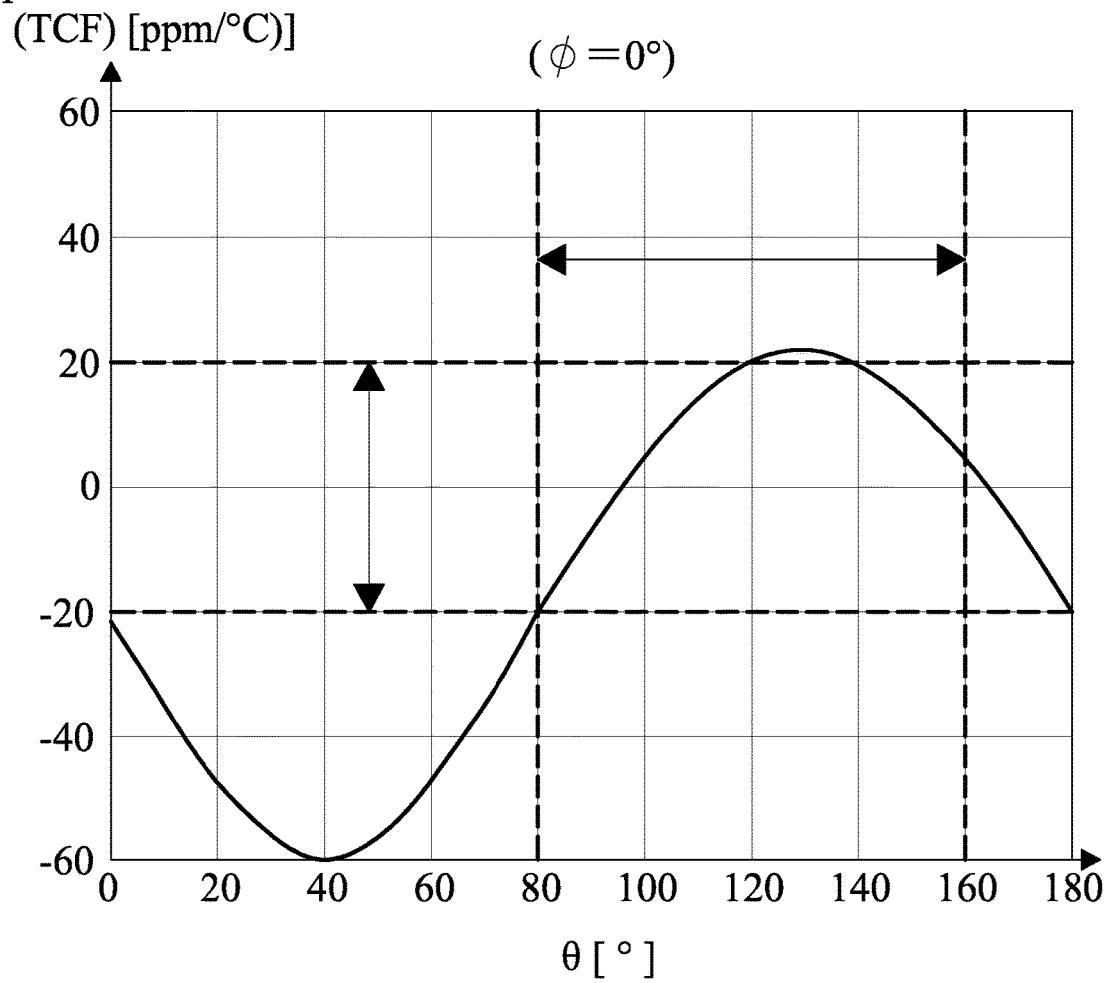
FIG. 8 shows a graph of a relationship between the angle $\theta$ and the temperature characteristic (TCF) of the rotated Y-cut plate of LT.

FIG. 8 shows a relationship between the angle θ and the temperature characteristic (TCF) of the rotated Y-cut plate of LT. In FIG. 8, the angle φ is assumed to be zero. The temperature characteristic (TCF) indicates, in ppm/degree C., the change rate of the resonance frequency for a 1-degree-C change in temperature, which is equivalent to the change rate of the frequency characteristic with respect to temperature change. In terms of temperature characteristic (TCF), the smaller the absolute value, the better the characteristic.

As shown in FIG. 8, by setting the angle θ of the rotated Y-cut plate within a range between 80 degrees and 160 degrees (80 degrees-160 degrees), the temperature characteristic can be set within the range approximately between −20 ppm/degree C. and 20 ppm/degree C.

In other words, when LT is applied to the piezoelectric layer 16, both a high electromechanical coupling coefficient K and a low temperature characteristic can be achieved by setting the angle θ of the rotated Y-cut plate within a range between 80 degrees and 160 degrees (80 degrees-160 degrees).

Figure 9:
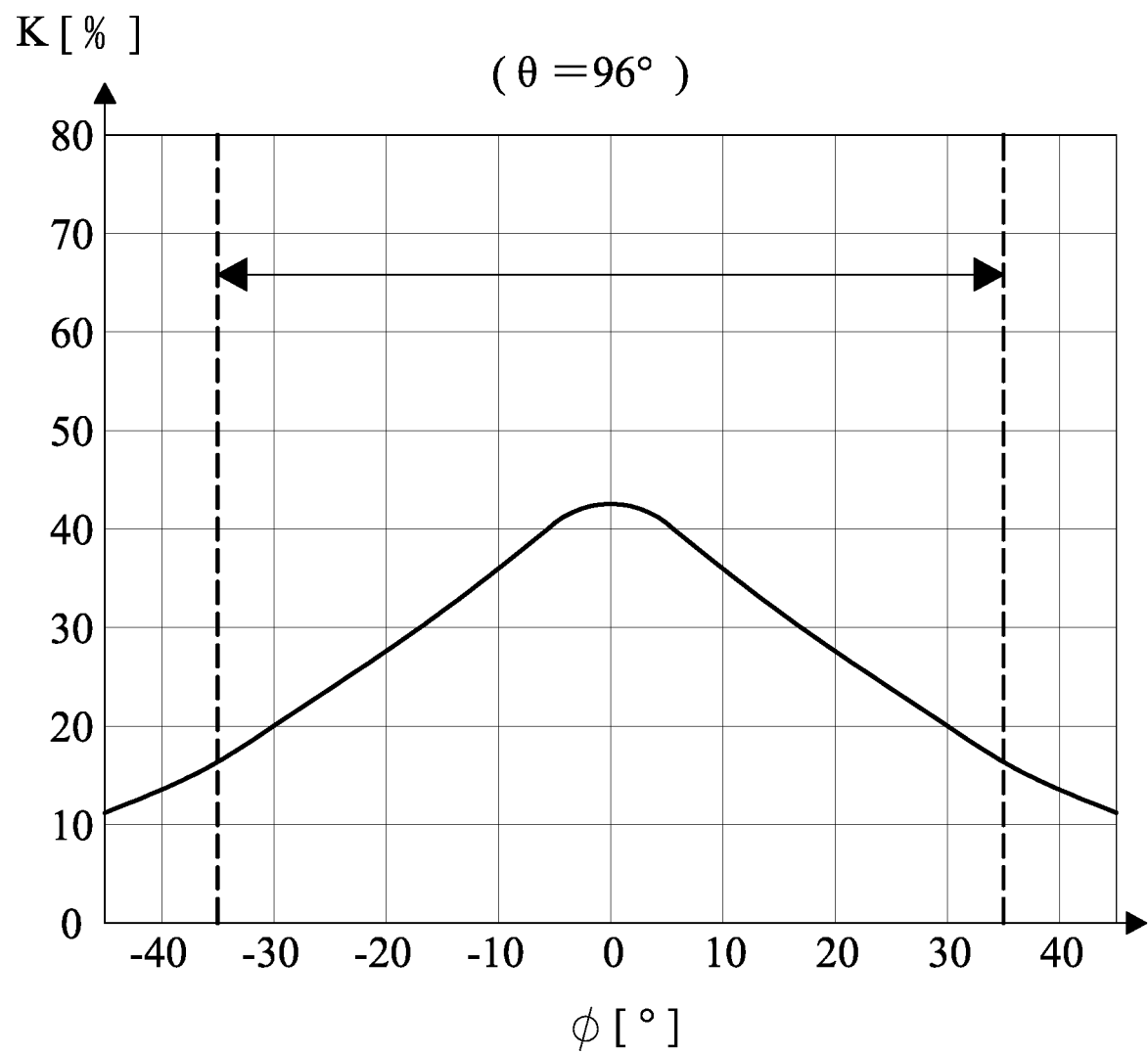
FIG. 9 shows a graph of an example of a relationship between an angle $\varphi$ and the electromechanical coupling coefficient K when the angle $\theta$ of the rotated Y-cut plate of LT is 96 degrees.
Figure 10:
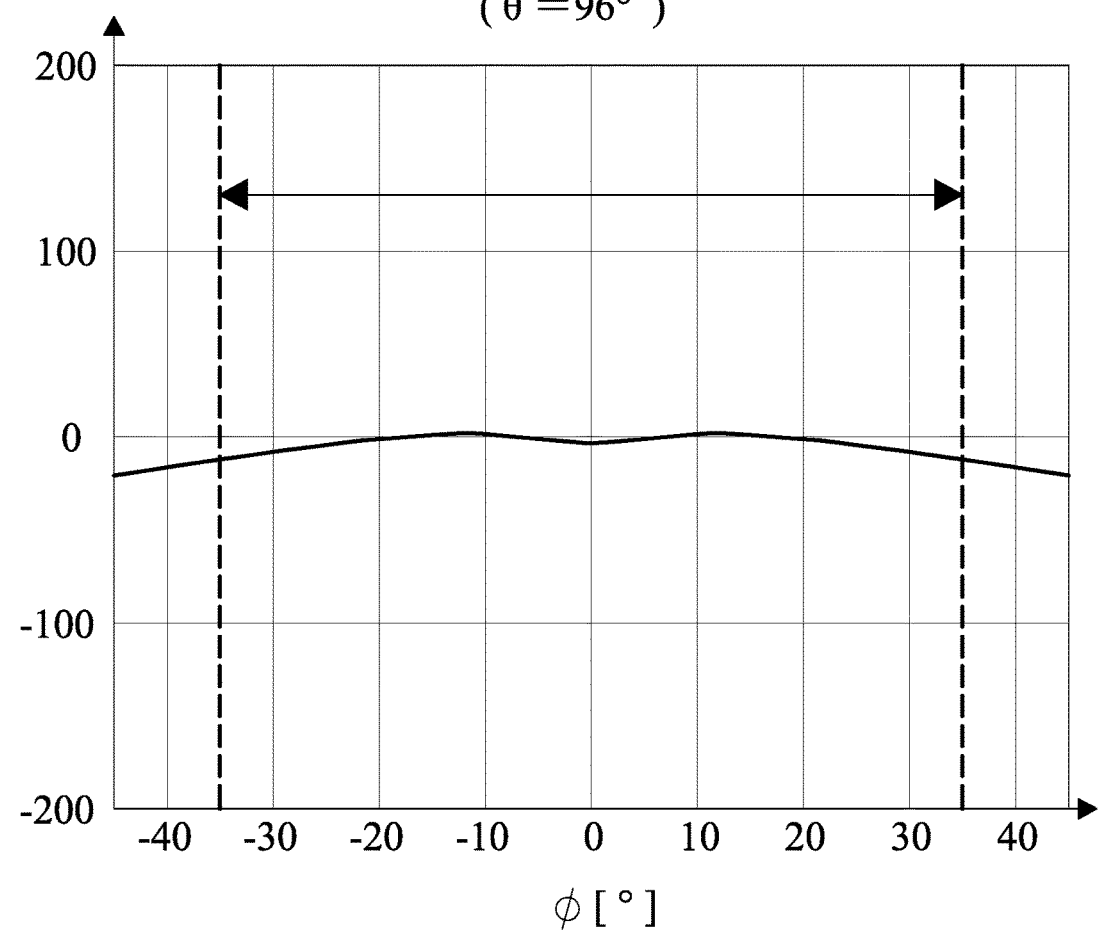
FIG. 10 shows a graph of a relationship between the angle $\varphi$ and the temperature characteristic (TCF) when the angle $\theta$ of the rotated Y-cut plate of LT is 96 degrees.

FIG. 9 shows an example of a relationship between the angle φ and the electromechanical coupling coefficient K of the rotated Y-cut plate of LT when the angle θ of the rotated Y-cut plate of LT is 96 degrees. FIG. 10 shows a relationship between the angle φ and the temperature characteristic (TCF) of the rotated Y-cut plate of LT when the angle θ of the rotated Y-cut plate of LT is 96 degrees.

As shown in FIG. 9, for the rotated Y-cut plate of LT, when varying the angle φ from 0 degrees while keeping the angle θ at 96 degrees, the electromechanical coupling coefficient K tends to decrease. However, as shown in FIG. 10, when varying the angle φ from 0 degrees while keeping the angle θ at 96 degrees, the temperature characteristic approaches zero.

Accordingly, by setting the angle φ of the rotated Y-cut plate of LT within a range between −35 degrees and 35 degrees (−35 degrees-35 degrees), the temperature characteristic can be improved (e.g., approximately zero) while suppressing the decrease in the electromechanical coupling coefficient K (e.g., at about 10% or more).

Therefore, for example, when the electromechanical coupling coefficient K is important, the angle φ may be set closer to zero, and when the temperature characteristic is important, the angle φ may be set closer to −35 degrees or 35 degrees. For example, for achieving an even balance between the electromechanical coupling coefficient K and the temperature characteristic, the angle φ may be set to about an intermediate value between −35 degrees and 0 degrees, or may be set to about an intermediate value between 35 degrees and 0 degrees.

FIGS. 9 and 10 show an example where the angle θ is 96 degrees. However, the angle θ is not limited to 96 degrees, and when the angle θ is in a range between 80 degrees and 160 degrees, the angle φ can also be set within a range between −35 degrees and 35 degrees.

In a case where a single crystal of lithium tantalate that has undergone at least one of pyroelectric treatment, Fe-doping treatment, or Mg-doping treatment is applied to the piezoelectric layer 16, the angle θ may also be set within a range between 80 degrees and 160 degrees, and the angle φ may also be set within a range between −35 degrees and 35 degrees.

Thus, in the case of LT, the rotated Y-cut plate can be used as the piezoelectric layer 16 when the rotated Y-cut plate is obtained as follows: cutting a single crystal of LT along a plane obtained by rotating, about the X-axis, a surface of the single crystal that is orthogonal to the Y-axis by an angle within a range between 80 degrees and 160 degrees, and further rotating, about the Z-axis, the rotated surface by an angle within a range between −35 degrees and 35 degrees. This improves the electromechanical coupling coefficient K of the bulk wave resonator 10 so as to maintain the required electromechanical coupling coefficient K. The temperature characteristic of the bulk wave resonator 10 can also be improved by applying LT with the above-stated conditions to the piezoelectric layer 16.

As will be discussed below, a difference in frequency between the resonance point and the anti-resonance point of the bulk wave resonator tends to be larger as the electromechanical coupling coefficient K increases. Increase in the difference in frequency between the resonance point and the anti-resonance point allows a bandpass filter having the bulk wave resonator to have a wider bandwidth. In other words, the electromechanical coupling coefficient K of the bulk wave resonator can be increased by applying a rotated Y-cut plate satisfying the conditions shown in FIG. 6 to the piezoelectric layer 16. Accordingly, by using the bulk wave resonator thus configured, a bandpass filter having a wider bandwidth can be realized.

Figure 11:
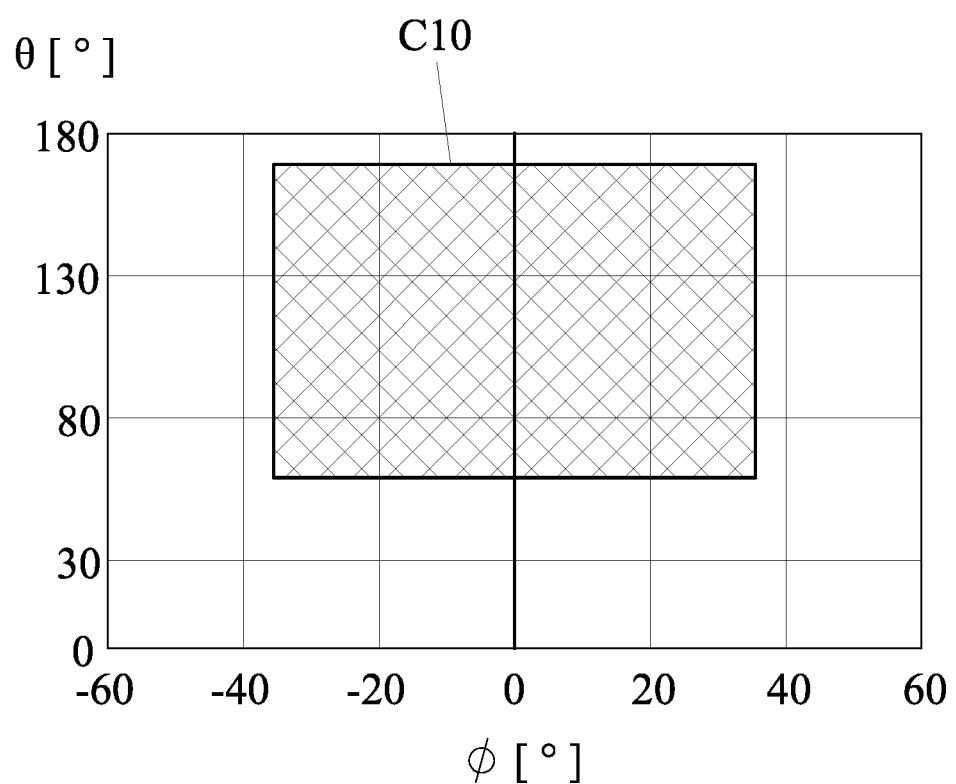
FIG. 11 illustrates a graph of a setting range of the cut angle of the rotated Y-cut plate when lithium niobate (LN) is applied to the piezoelectric layer.

FIG. 11 illustrates a setting range of the cut angle of the rotated Y-cut plate when lithium niobate is applied to the piezoelectric layer 16. Lithium niobate is hereinafter abbreviated as LN.

When LN is applied to the piezoelectric layer 16, the angle θ of the rotated Y-cut plate of a single crystal of LN about the X-axis is set within the range between 60 degrees and 170 degrees, and the angle φ of the rotated Y-cut plate of the single crystal of LN about the Z-axis is set within the range between −35 degrees and 35 degrees. That is, the cut angle of the rotated Y-cut plate of LN is set to any value within a range indicated by a cross-hatching C10 in FIG. 11.

Figure 12:
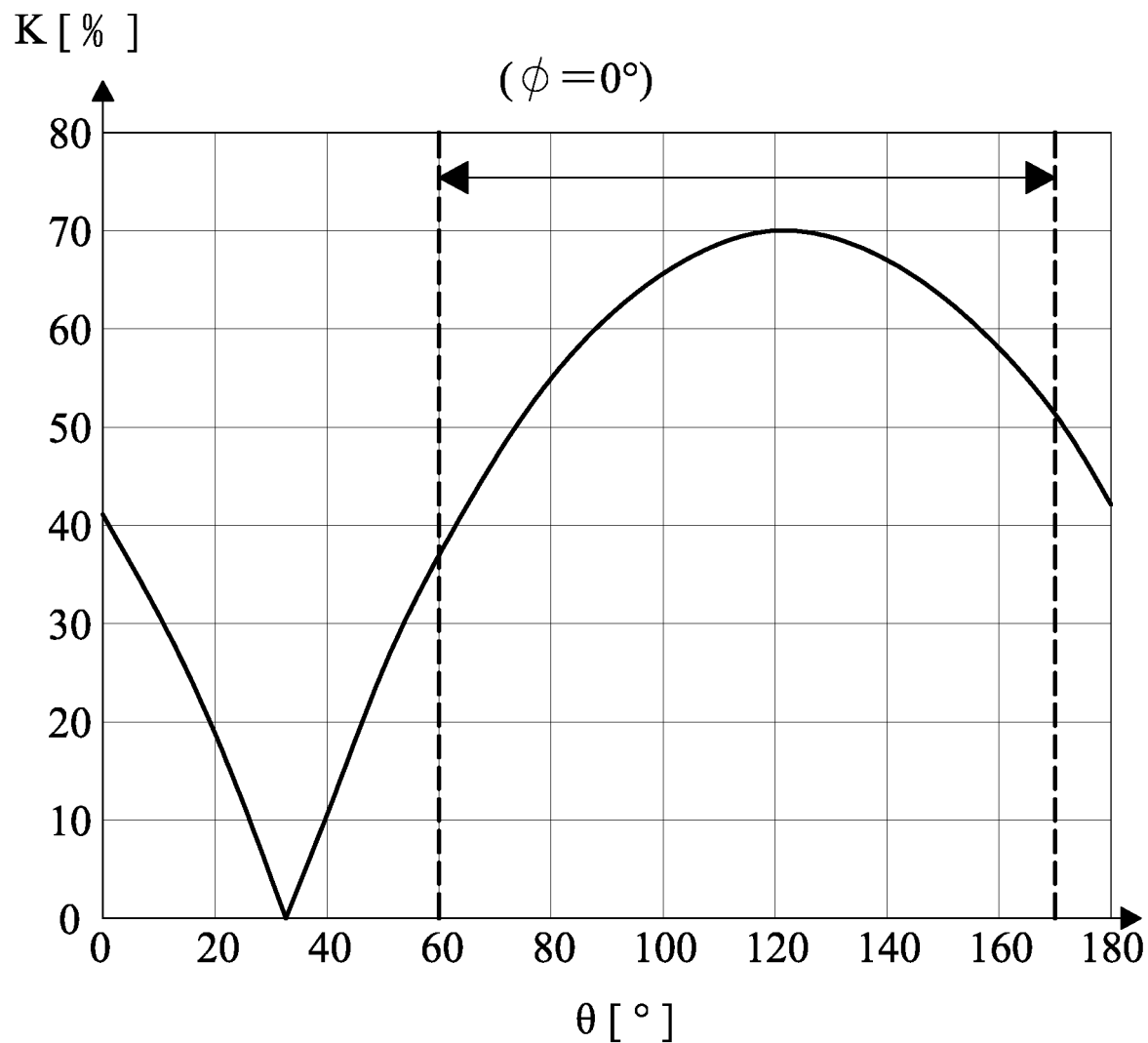
FIG. 12 shows a graph of a relationship between the angle $\theta$ of the rotated Y-cut plate of LN and the electromechanical coupling coefficient K.

FIG. 12 shows a relationship between the angle θ and the electromechanical coupling coefficient K of the rotated Y-cut plate of LN. In FIG. 12, the angle φ is assumed to be zero.

As shown in FIG. 12, the electromechanical coupling coefficient K can be set to be approximately 35% or more by setting the angle θ to a range between 60 degrees and 170 degrees (60 degrees-170 degrees).

Figure 13:
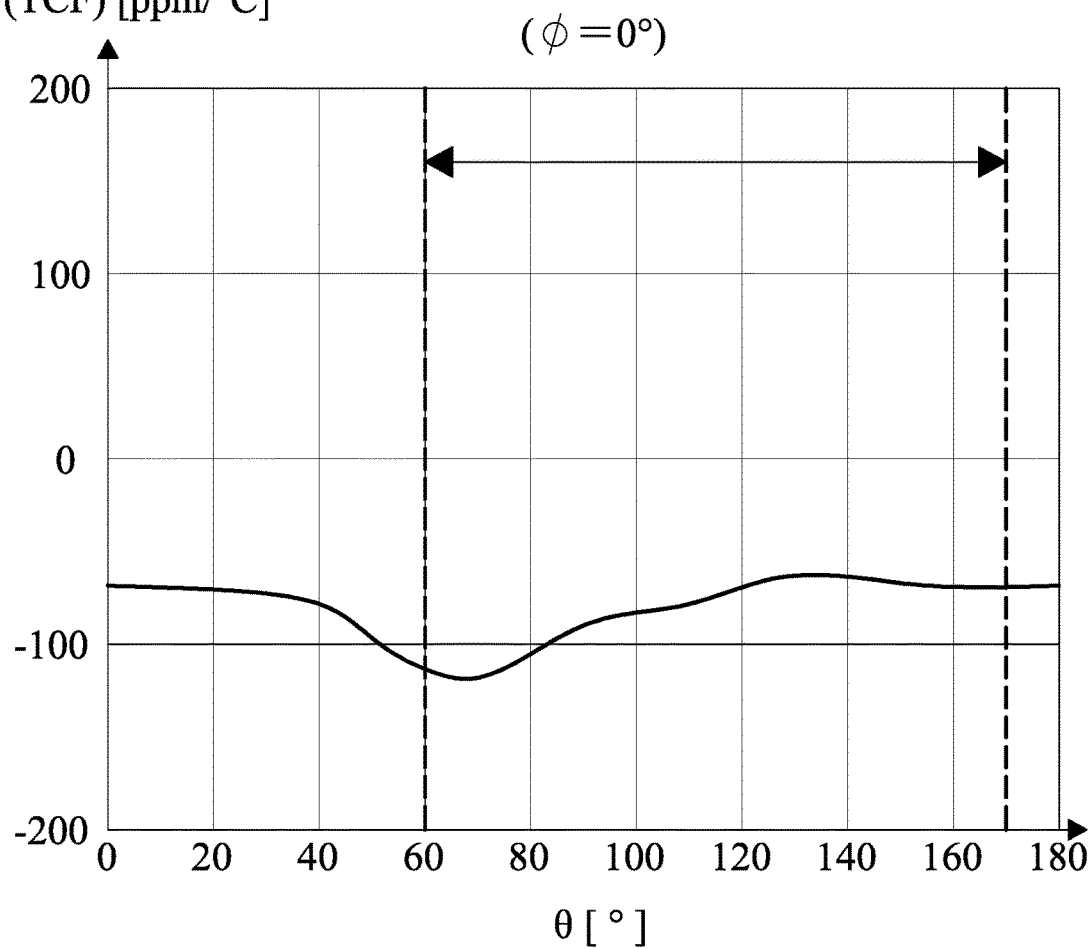
FIG. 13 shows a graph of a relationship between the angle $\theta$ and the temperature characteristic (TCF) of the rotated Y-cut plate of LN.

FIG. 13 shows a relationship between the angle θ and the temperature characteristic (TCF) of the rotated Y-cut plate of LN. In FIG. 13, the angle φ is assumed to be zero.

As shown in FIG. 13, in the case of LN, the range between 60 degrees and 170 degrees (60 degrees-170 degrees) is set due to prioritizing the electromechanical coupling coefficient K over the temperature characteristic.

Figure 14:
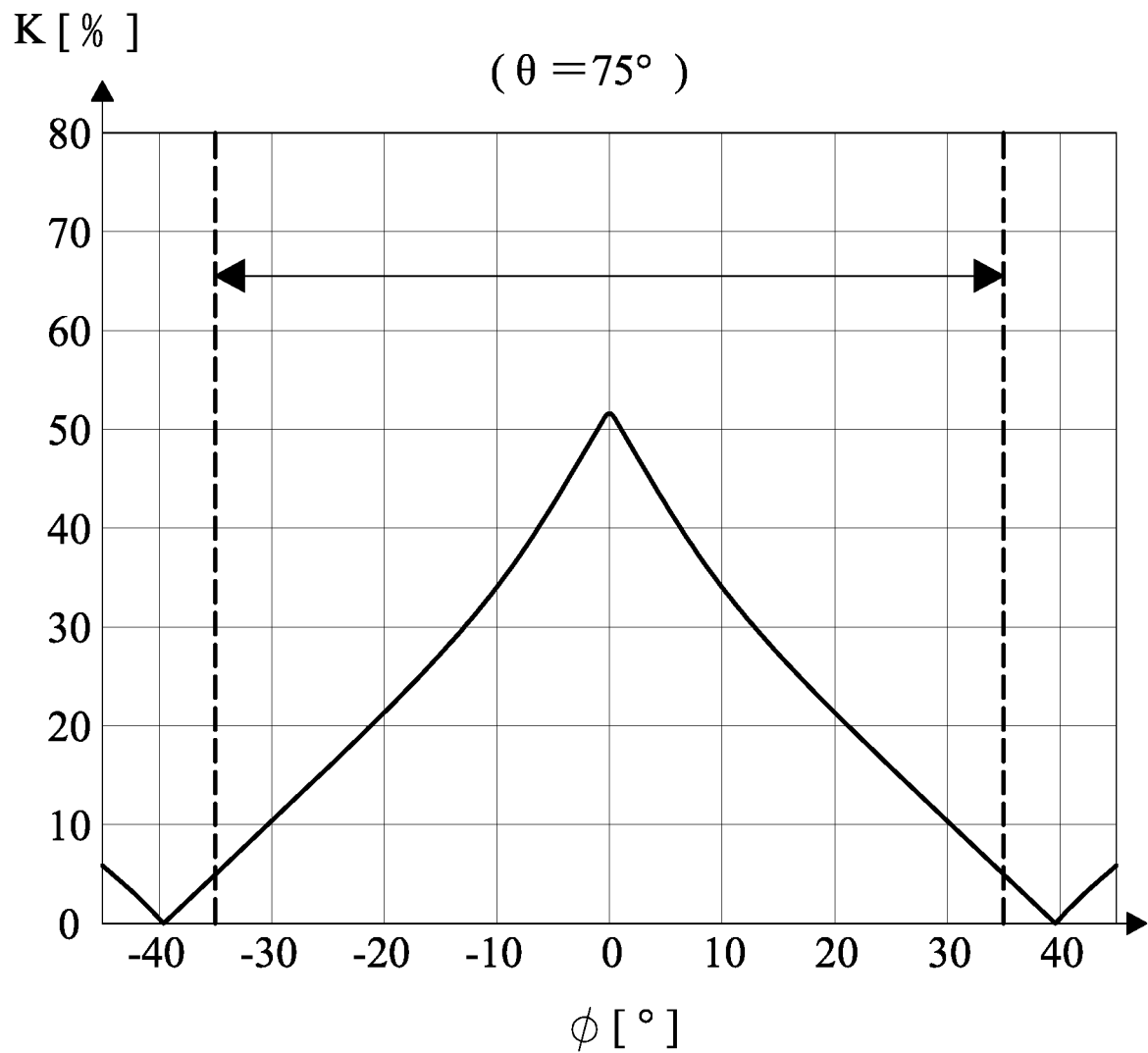
FIG. 14 shows a graph of a relationship between the angle $\varphi$ and the electromechanical coupling coefficient K when the angle $\theta$ of the rotated Y-cut plate of LN is 75 degrees.
Figure 15:
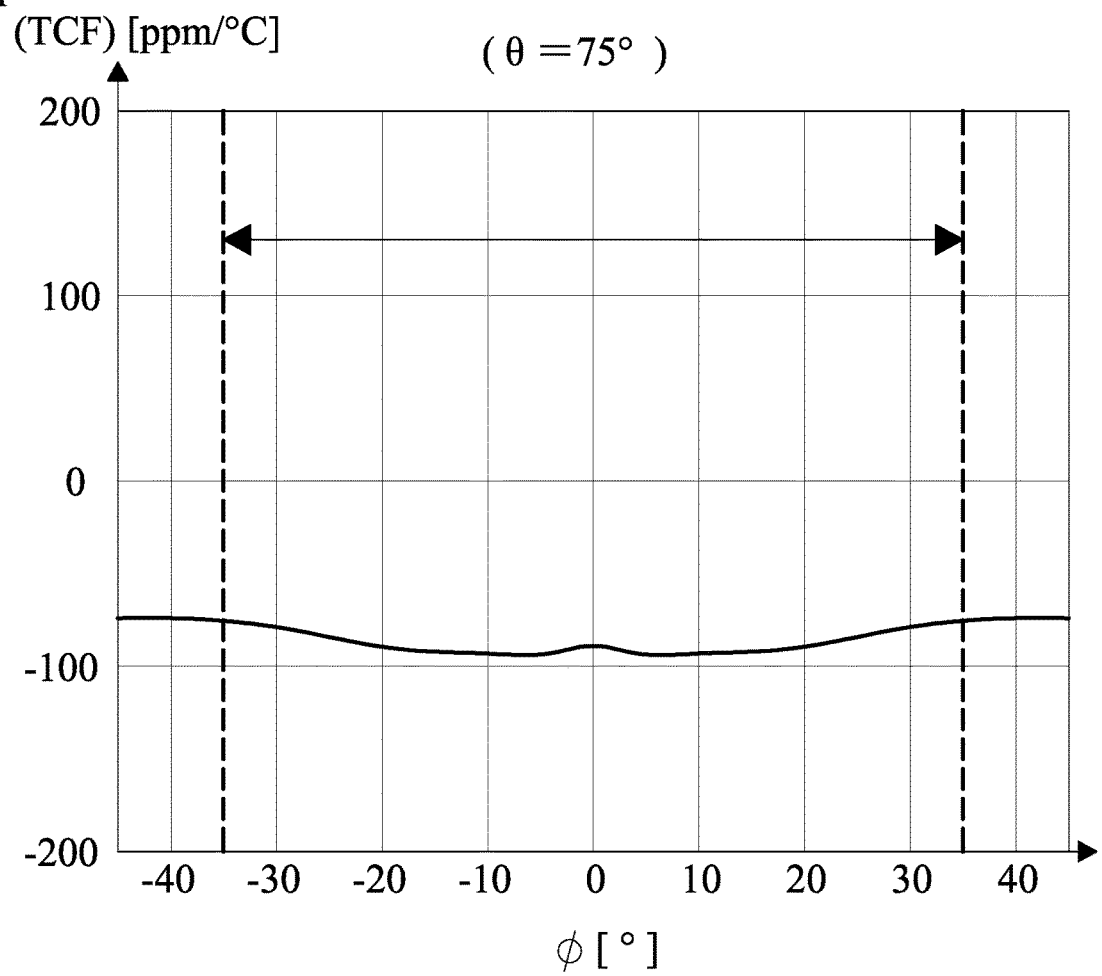
FIG. 15 shows a graph of a relationship between the angle $\varphi$ and the temperature characteristic (TCF) when the angle $\theta$ of the rotated Y-cut plate of LN is 75 degrees.

FIG. 14 shows an example of a relationship between the angle φ and the electromechanical coupling coefficient K of the rotated Y-cut plate of LN when the angle θ of the rotated Y-cut plate of LN is 75 degrees. FIG. 15 shows a relationship between the angle φ and the temperature characteristic (TCF) of the rotated Y-cut plate of LN when the angle θ of the rotated Y-cut plate of LN is 60 degrees.

As shown in FIG. 14, for the rotated Y-cut plate of LN, the electromechanical coupling coefficient K can be increased by varying the angle φ while keeping the angle θ at 75 degrees. Meanwhile, as shown in FIG. 15, for the rotated Y-cut plate of LN, when varying the angle φ while keeping the angle θ at 75 degrees, the absolute value of the temperature characteristic decreases slightly.

Accordingly, in the case of LN, by setting the angle φ of the rotated Y-cut plate within a range between −35 degrees and 35 degrees (−35 degrees-35 degrees), the electromechanical coupling coefficient K can be increased up to approximately 70%, and the absolute value of the temperature characteristic can be reduced to below 100 ppm/degree C. when the angle φ of the rotated Y-cut plate is within a range between −35 degrees and 35 degrees.

In addition, FIGS. 14 and 15 show an example where the angle θ is 75 degrees. However, the angle θ is not limited to 75 degrees, and when the angle θ is in a range between 60 degrees and 170 degrees, the angle φ can also be set within a range between −35 degrees and 35 degrees.

More specifically, in a case where a single crystal of lithium niobate that has undergone at least one of pyroelectric treatment, Fe-doping treatment, or Mg-doping treatment is applied to the piezoelectric layer 16, the angle θ may also be set within the range between 60 degrees and 170 degrees, and the angle φ may also be set within a range between −35 degrees and 35 degrees.

Thus, in the case of LN, the rotated Y-cut plate can be used as the piezoelectric layer 16 when the rotated Y-cut plate is obtained as follows: cutting a single crystal of LN along a plane obtained by rotating, about the X-axis, a surface of the single crystal that is orthogonal to the Y-axis by an angle within a range between 60 degrees and 170 degrees, and further rotating, about the Z-axis, the rotated plane by an angle within a range between −35 degrees and 35 degrees. This improves the electromechanical coupling coefficient K of the bulk wave resonator 10 so as to maintain the required electromechanical coupling coefficient K. The temperature characteristic of the bulk wave resonator 10 can also be improved by applying LN with the above-stated conditions to the piezoelectric layer 16.

Since the electromechanical coupling coefficient K can be increased by applying the rotated Y-cut plate with the conditions shown in FIG. 11 to the piezoelectric layer 16, a bandpass filter having a wider bandwidth can be realized by using such bulk wave resonator. In addition, a bulk wave resonator of the second embodiment to which LN is applied can have a greater electromechanical coupling coefficient K than a bulk wave resonator of the second embodiment to which LT is applied, so the bandwidth of the bandpass filter can be further broadened by applying such bulk wave resonator.

Third Embodiment

Figure 16:
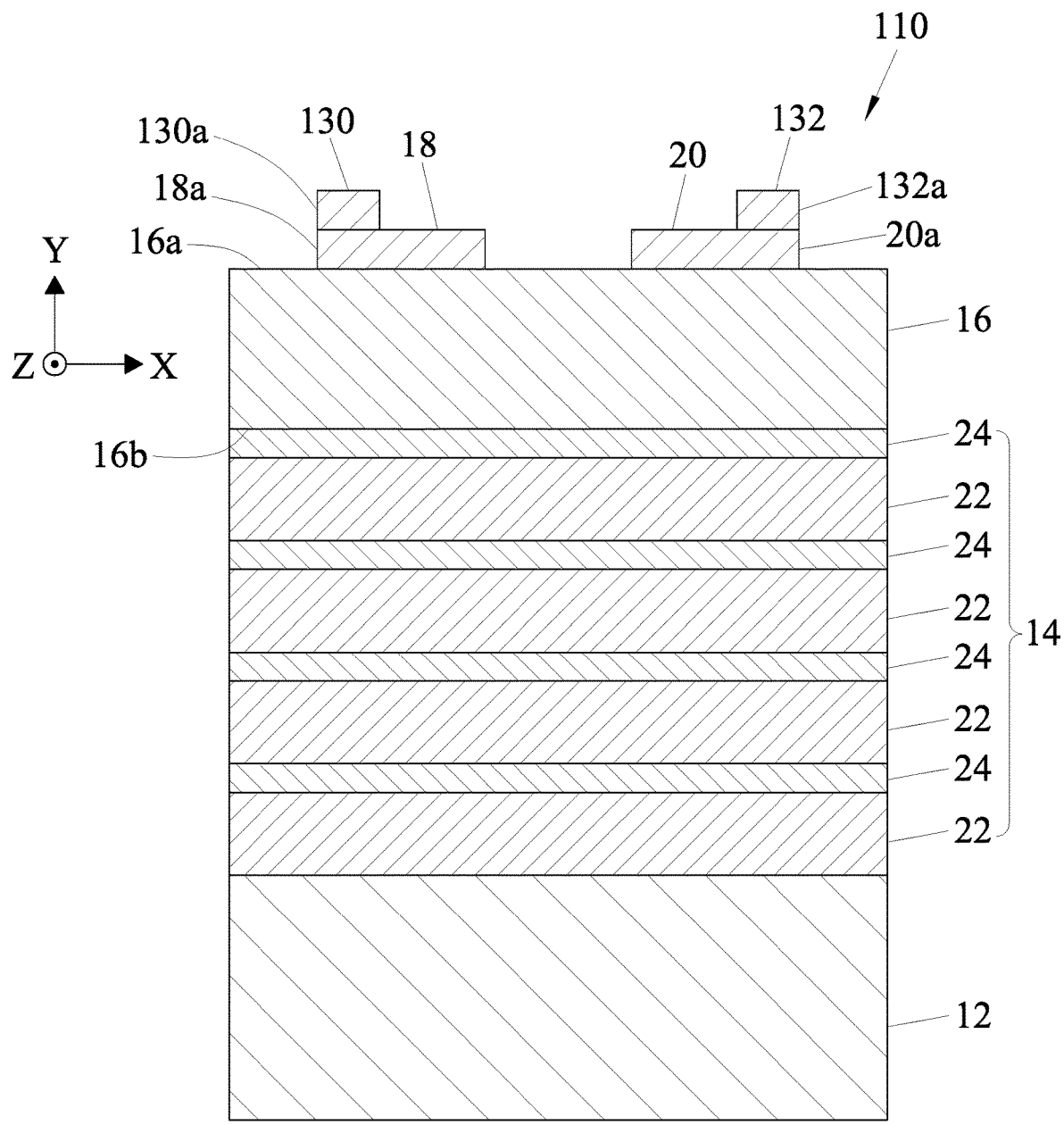
FIG. 16 is a schematic cross-sectional view illustrating structure of the bulk wave resonator of a third embodiment according to the invention.
Figure 17:
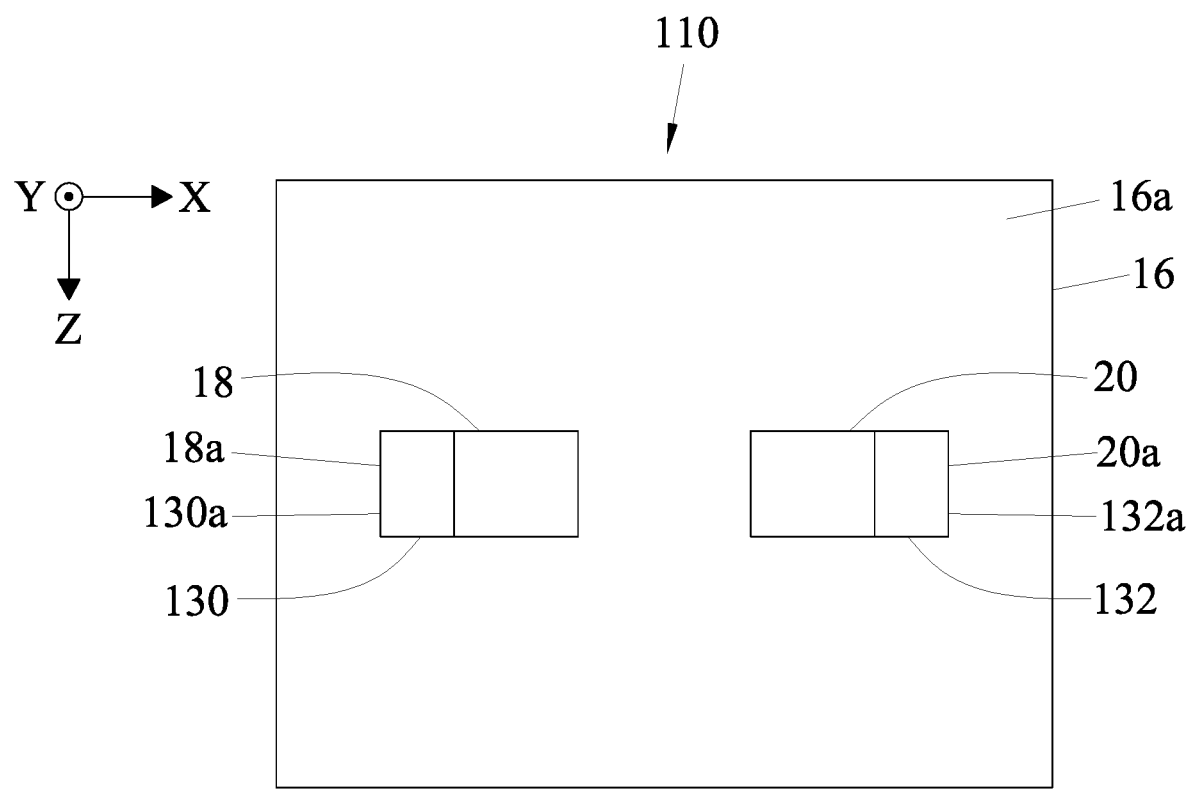
FIG. 17 is a schematic plan view illustrating the structure of the bulk wave resonator of the third embodiment according to the invention.

FIG. 16 is a schematic cross-sectional view of the bulk wave resonator 110 of a third embodiment according to the invention. FIG. 17 is a schematic plan view of the bulk wave resonator 110 of the third embodiment. The bulk wave resonator 110 of the third embodiment differs from the bulk wave resonator 10 of the first embodiment by including a first load 130 and a second load 132, and the other configurations thereof are the same as the bulk wave resonator 10 of the first embodiment. In the following, descriptions about structures of the third embodiment that are the same as the first embodiment will be omitted, and the different structures will be described in detail. It is noted that, with respect to the piezoelectric layer 16, the configuration of the second embodiment may be applied to the third embodiment.

As shown in FIGS. 16 and 17, the first load 130 is disposed on the first electrode 18. For example, the first load 130 is formed to have the shape of a rectangular flat plate that is smaller than the first electrode 18. The first load 130 is disposed such that an end face 130a thereof that is opposite to the second electrode 20 matches an end face 18a of the first electrode 18 that is opposite to the second electrode 20. As an example, the first load 130 is configured to extend from a side of the first electrode 18 toward another side of the first electrode 18 in the width direction of the first electrode 18 (i.e., the Z-direction). Moreover, as long as the first load 130 is disposed on the first electrode 18, the end face 130a of the first load 130 is not limited to matching the end face 18a of the first electrode 18.

The second load 132 is disposed on the second electrode 20. For example, the second load 132 is formed to have a shape of a rectangular flat plate that is smaller than the second electrode 20. The second load 132 is disposed such that an end face 132a thereof that is opposite to the first electrode 18 matches an end face 20a of the second electrode 20 that is opposite to the first electrode 18. As an example, the second load 132 is configured to extend from a side of the second electrode 20 toward another side of the second electrode 20 in the width direction of the second electrode 20 (i.e., the Z-direction). Moreover, as long as the second load 132 is disposed on the second electrode 20, the end face 132a of the second load 132 is not limited to matching the end face 20a of the second electrode 20.

The first load 130 and the second load 132 may be made of, for example, aluminum (Al). However, the first load 130 and the second load 132 are not limited to being made of aluminum, and may be made of other metals.

The bulk wave resonator 10 of the first embodiment (see FIGS. 1 and 2.) that does not include the first and second loads 130, 132 is given herein as a comparative example. For the bulk wave resonator 10 that utilizes thickness shear vibration, the dispersion curve (dispersion relation) about the fundamental wave of the bulk wave (the first-order mode of resonance) exhibits the low-frequency cutoff characteristics. In addition, the dispersion curve is a curve that shows a relationship between a wavenumber and an angular frequency. However, for the bulk wave resonator 10 that utilizes thickness shear vibration, since the vibration is excited by a parallel electric field, the energy confinement condition of the fundamental wave of the bulk wave in the X-direction (the direction in which the first electrode 18 and the second electrode 20 are opposite to each other) is not satisfied.

Therefore, in the bulk wave resonator 10 that utilizes thickness shear vibration, the bulk wave (fundamental wave) generated between the first electrode 18 and the second electrode 20, which are disposed on the piezoelectric layer 16, propagates in the X-direction. A part of the bulk wave that propagates toward the end face 18a of the first electrode 18 is reflected toward the second electrode 20 at the position of the end face 18a of the first electrode 18, which is disposed on the piezoelectric layer 16; and a part of the bulk wave that propagates toward the end face 20a of the second electrode 20 is reflected toward the first electrode 18 at the position of the end face 20a of the second electrode 20, which is disposed on the piezoelectric layer 16. As a result, the bulk wave in the X-direction forms a standing wave in the region between the end surface 18a and the end surface 20a on the piezoelectric layer 16. When such standing wave is formed, unintended spurious emissions may be generated near the frequency of the fundamental wave.

Figure 18:
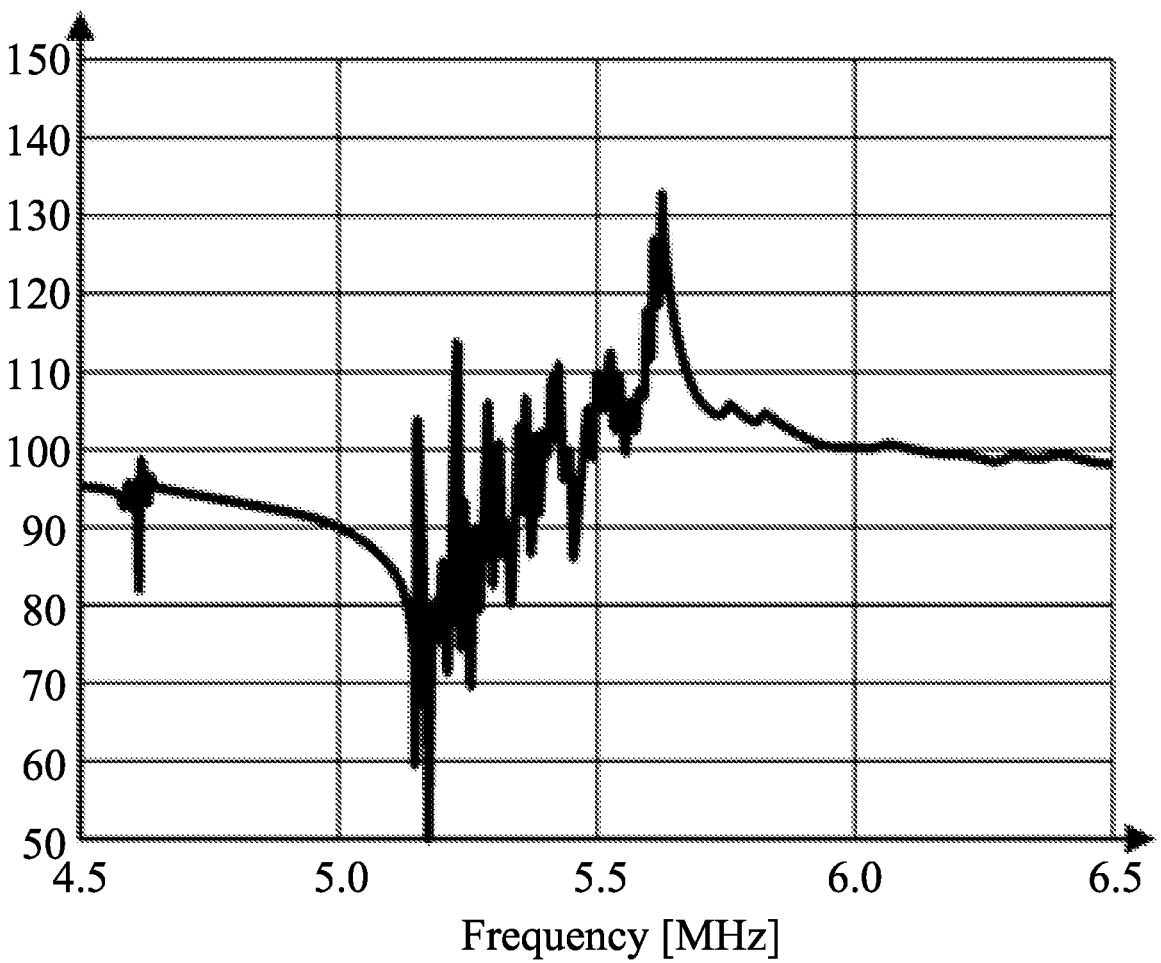
FIG. 18 shows a graph of an example of frequency characteristic of impedance of the bulk wave resonator of a comparative example (the first embodiment) which does not include first and second loads.

FIG. 18 is a graph that shows an example of the frequency characteristic of impedance of the bulk wave resonator 10 of the comparative example (the first embodiment), which does not include the first load 130 and the second load 132. In respect of the frequency characteristic of impedance, a part where the impedance drops steeply is sometimes referred to as a resonance point. The frequency of the resonance point corresponds to the resonance frequency. In addition, in respect of the impedance frequency characteristic, a part where the impedance rises steeply is sometimes referred to as an anti-resonance point.

As shown in FIG. 18, a disturbance of the resonance characteristic occurs from around the resonance point to around the anti-resonance point. Such disturbance of the resonance characteristic indicates that spurious emissions have generated.

Figure 19:
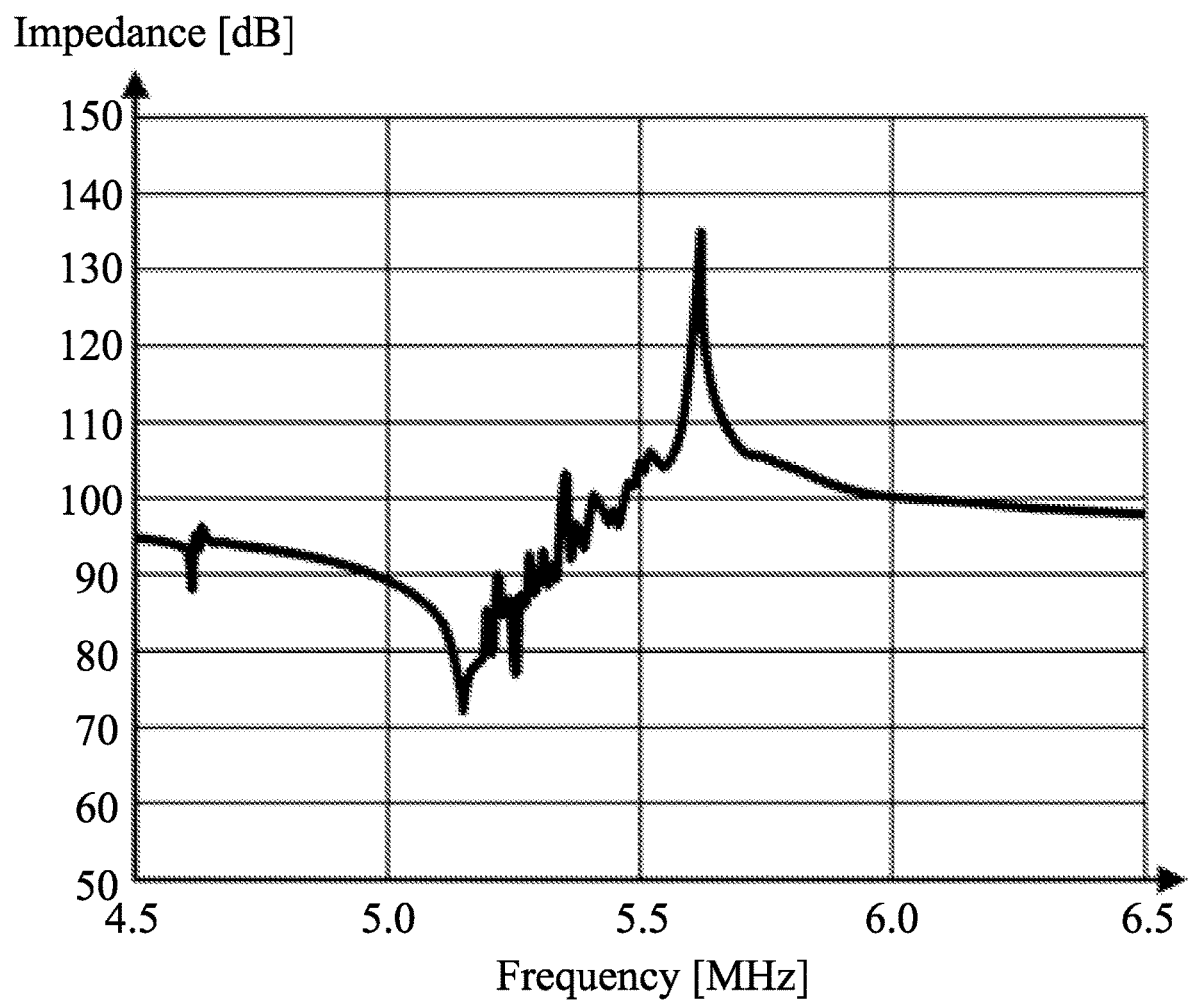
FIG. 19 shows a graph of an example of frequency characteristic of impedance of the bulk wave resonator of the third embodiment which includes the first and second loads.

In contrast, FIG. 19 is a graph that shows an example of the frequency characteristic of impedance of the bulk wave resonator 110 of the third embodiment, which includes the first load 130 and the second load 132. Compared to FIG. 18, in FIG. 19, the disturbance of the resonance characteristic from around the resonance point to around the anti-resonance point is alleviated. This means that, according to the bulk wave resonator 110 of the third embodiment, by virtue of the first load 130 and the second load 132, unintended spurious emissions in the vicinity of the frequency of the fundamental wave can be alleviated.

The reason why spurious emissions can be alleviated by providing the first load 130 and the second load 132 may be assumed to be as follows. It is assumed that the first load 130 serves the function of an absorber that absorbs energy of the bulk wave that is reflected at the position of the end face 18a of the first electrode 18 on the piezoelectric layer 16, thereby reducing the reflection of the bulk wave at the position of the end surface 18a of the first electrode 18 on the piezoelectric layer 16. Similarly, it is assumed that the second load 132 serves the function of an absorber that absorbs energy of the bulk wave that is reflected at the position of the end face 20a of the second electrode 20 on the piezoelectric layer 16, thereby reducing the reflection of the bulk wave at the position of the end surface 20a of the second electrode 20 on the piezoelectric layer 16. As a result, it is assumed that the formation of standing waves in the region between the end face 18a and the end face 20a on the piezoelectric layer 16 is suppressed, so spurious emissions caused by standing waves can be alleviated.

Moreover, other than the first load 130 and the second load 132, the rest of the components of the bulk wave resonator 110 of the third embodiment are the same as those of the first embodiment, so higher resonant frequency can also be set according to the bulk wave resonator 110 of the third embodiment, as with the first embodiment.

Fourth Embodiment

Figure 20:
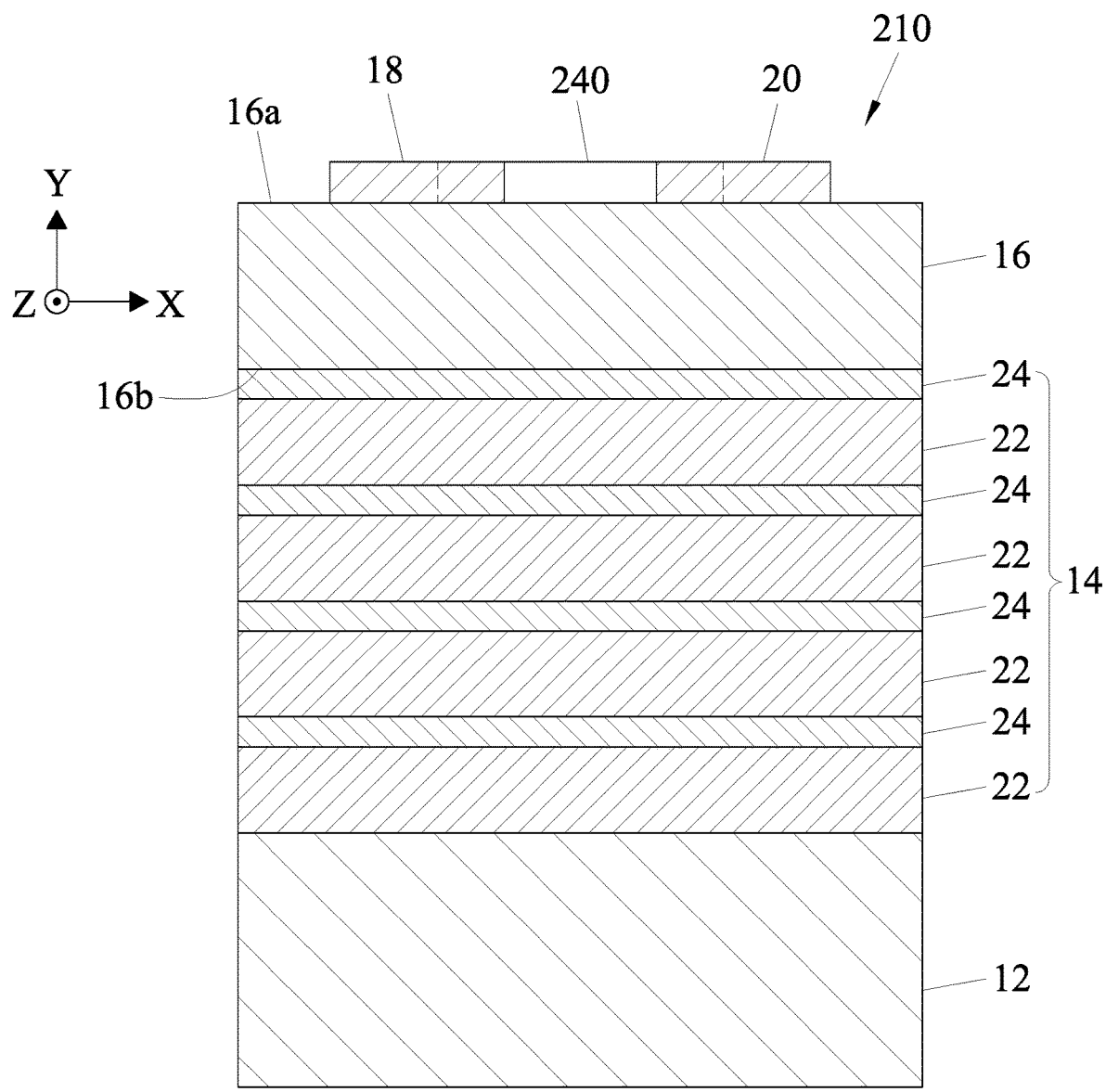
FIG. 20 is a schematic cross-sectional view of structure of the bulk wave resonator of a fourth embodiment according to the invention.
Figure 21:
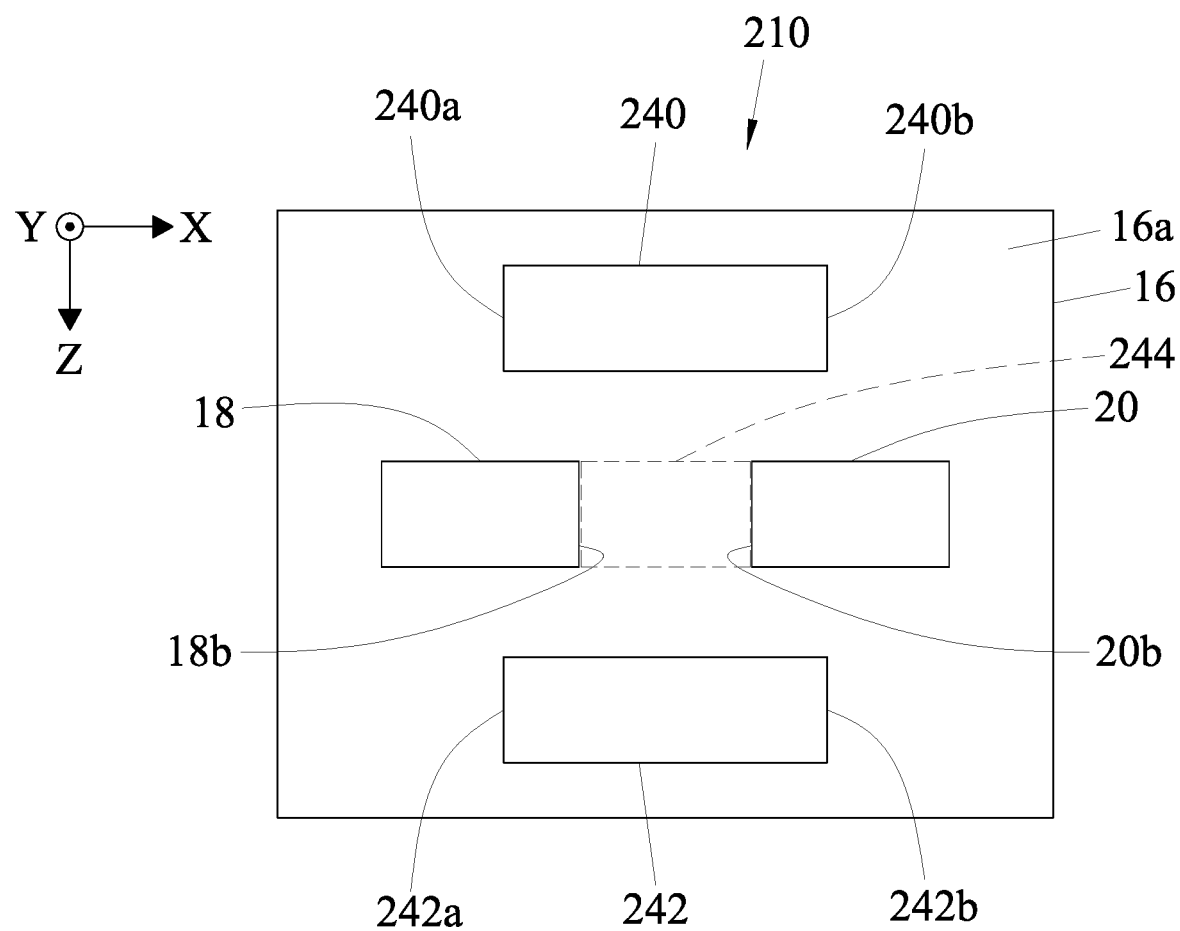
FIG. 21 is a schematic plan view of the structure of the bulk wave resonator of the fourth embodiment according to the invention.

FIG. 20 is a schematic cross-sectional view of a fourth embodiment of the bulk wave resonator 210 according to the invention. FIG. 21 is a schematic plan view of the bulk wave resonator 210 of the fourth embodiment. The bulk wave resonator 210 of the fourth embodiment differs from the bulk wave resonator 10 of the first embodiment by including a first suppression electrode 240 and a second suppression electrode 242, and the other configurations thereof are the same as the bulk wave resonator 10 of the first embodiment. In the following, descriptions about structures of the fourth embodiment that are the same as the first embodiment will be omitted, and only the different structures will be described in detail. In addition, with respect to the piezoelectric layer 16, the configuration of the second embodiment may be applied.

As shown in FIGS. 20 and 21, the first suppression electrode 240 and the second suppression electrode 242 are disposed on a surface of the piezoelectric layer 16 on which the first electrode 18 and the second electrode 20 are disposed (i.e., the upper surface 16a). In other words, the first suppression electrode 240 and the second suppression electrode 242 are disposed on a surface of the piezoelectric layer 16 opposite to the acoustic multilayer film 14 (i.e., the upper surface 16a). This means that, as with the first embodiment, in the bulk wave resonator 210 of the fourth embodiment, no electrode is disposed on a surface of the piezoelectric layer 16 that is located at the side of the acoustic multilayer film 14 (i.e., the lower surface 16b).

The first suppression electrode 240 and the second suppression electrode 242 are in contact with the piezoelectric layer 16. In addition, the first suppression electrode 240 and the second suppression electrode 242 are grounded through, for example, a lead wire (not shown).

The first suppression electrode 240 and the second suppression electrode 242 face each other in the second direction. The second direction is orthogonal to the first direction in which the first electrode 18 and the second electrode 20 face each other. Specifically, the first suppression electrode 240 and the second suppression electrode 242 face each other in the Z-direction, which is perpendicular to the X-direction.

In the illustrated embodiment, the X-direction corresponds to the first direction and the Z-direction corresponds to the second direction. However, the second direction is not limited to being a direction that is perpendicular to the first direction. For example, the second direction may be a direction that obliquely intersects the first direction.

In FIG. 21, a gap between the first electrode 18 and the second electrode 20 is indicated by a region 244 which is surrounded by the dashed line. The first suppression electrode 240 and the second suppression electrode 242 are arranged to face each other, with the gap (the region 244) between the first electrode 18 and the second electrode 20 being interposed therebetween. The first suppression electrode 240 and the second suppression electrode 242 are arranged to be spaced apart from the first electrode 18 and the second electrode 20. In other words, the first suppression electrode 240 and the second suppression electrode 242 are disposed so as not to overlap with the gap (the region 244) between the first electrode 18 and the second electrode 20.

Each of the first suppression electrode 240 and the second suppression electrode 242 is formed into, for example, the shape of a rectangular flat plate. A length in the X-direction of each of the first suppression electrode 240 and the second suppression electrode 242 is greater than the distance between the first electrode 18 and the second electrode 20 (i.e., the length of the region 244 in the X-direction).

An end face 240a of the first suppression electrode 240 which is located at a side of the first electrode 18 in the X-direction is situated closer to a side where the first electrode 18 is located as compared to an opposing face 18b of the first electrode 18 which faces the second electrode 20. An end face 240b of the first suppression electrode 240 which is located at a side of the second electrode 20 in the X-direction is situated closer to a side where the second electrode 20 is located as compared to an opposing face 20b of the second electrode 20 which faces the first electrode 18. An end face 242a of the second suppression electrode 242 which is located at a side of the first electrode 18 in the X-direction is situated closer to a side where the first electrode 18 is located as compared to the opposing face 18b of the first electrode 18. An end face 242b of the second suppression electrode 242 which is located at a side of the second electrode 20 in the X-direction is situated closer to a side where the second electrode 20 is located as compared to the opposing face 20b of the second electrode 20.

The bulk wave resonator 10 of the first embodiment that does not include the first suppression electrode 240 and the second suppression electrode 242 is given herein as a comparative example. When a high frequency AC voltage is applied between the first electrode 18 and the second electrode 20, electromagnetic waves may leak, along the Z-direction, from between the first electrode 18 and the second electrode 20. Such electromagnetic waves may become noises and may cause unintended spurious emissions.

Figure 22:
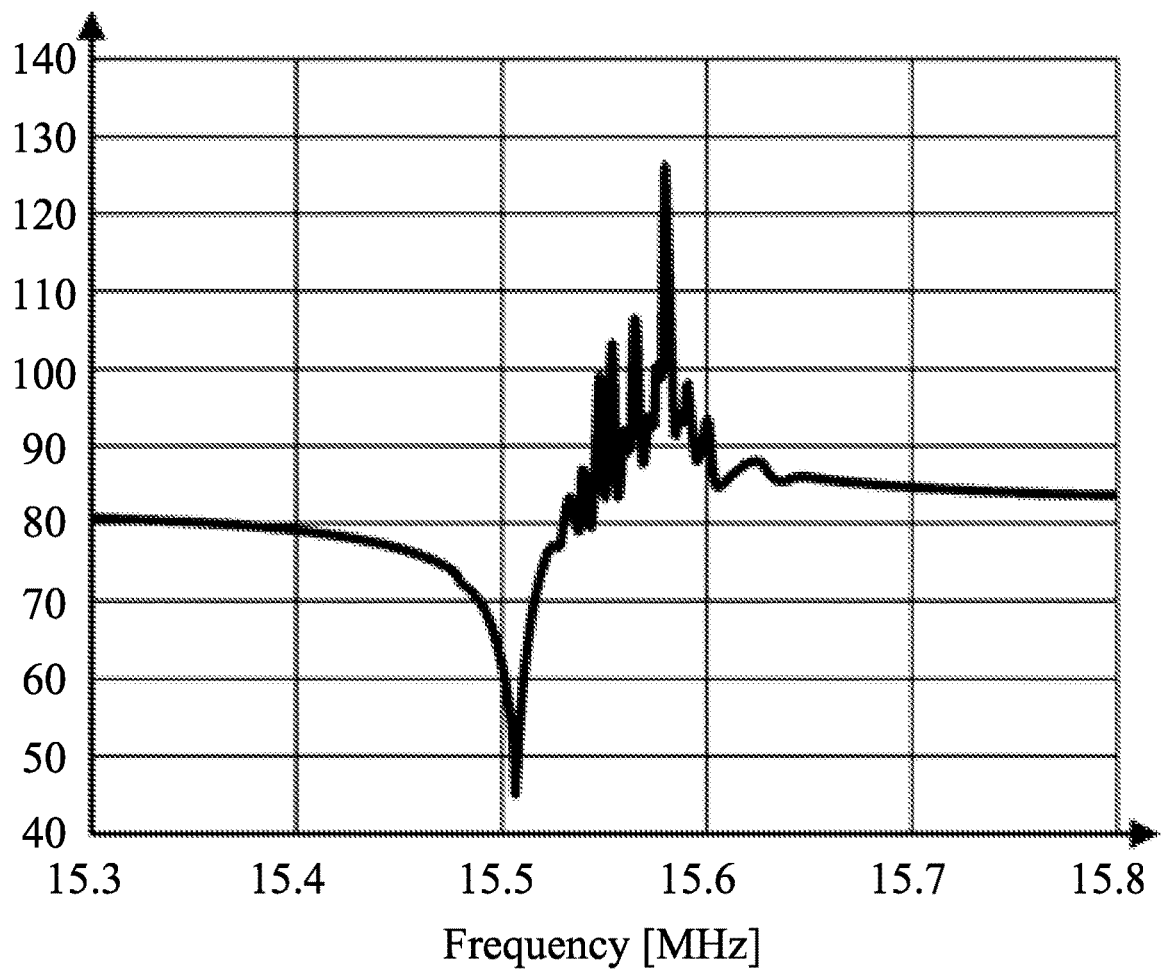
FIG. 22 shows a graph of an example of frequency characteristic of impedance of the bulk wave resonator of a comparative example (first embodiment) which does not include the first and second suppression electrodes.

FIG. 22 shows an example of the frequency characteristic of impedance of the bulk wave resonator 10 of the comparative example (the first embodiment), which does not include the first suppression electrode 240 and the second suppression electrode 242. FIG. 22 illustrates the frequency characteristic near the third harmonic of the resonance frequency. As shown in FIG. 22, a disturbance of the resonance characteristic occurs near the anti-resonance point. Such disturbance of the resonance characteristic indicates that spurious emissions have occurred.

Figure 23:
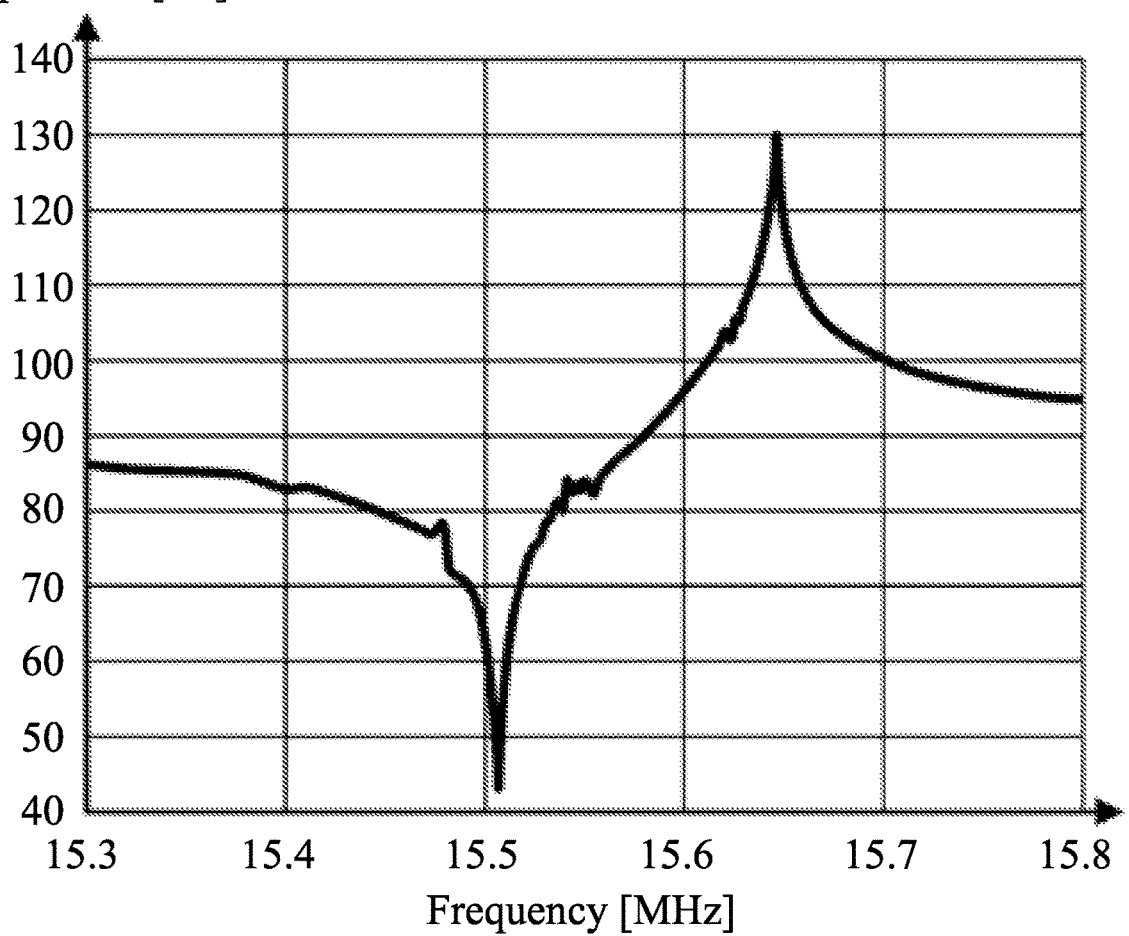
FIG. 23 shows a graph of an example of the frequency characteristic of impedance of the bulk wave resonator of the fourth embodiment which includes the first and second suppression electrodes.

In contrast, FIG. 23 shows an example of the frequency characteristic of impedance of the bulk wave resonator 210 of the fourth embodiment, which includes the first suppression electrode 240 and the second suppression electrode 242. FIG. 23 illustrates the frequency characteristic near the third harmonic of the resonance frequency. Compared to FIG. 22, in FIG. 23, the disturbance of the resonance characteristic near the anti-resonance point is alleviated. This means that, according to the bulk wave resonator 210 of the fourth embodiment, by virtue of the first suppression electrode 240 and the second suppression electrode 242, unintended spurious emissions can be alleviated.

The reason why spurious emissions can be alleviated by providing the first suppression electrode 240 and the second suppression electrode 242 may be assumed to be as follows. A part of the electromagnetic waves leaking from between the first electrode 18 and the second electrode 20 propagates in the direction toward the first suppression electrode 240. Since the first suppression electrode 240 is grounded, it absorbs the energy of the electromagnetic waves that reaches the first suppression electrode 240. In addition, a part of the electromagnetic waves leaking from between the first electrode 18 and the second electrode 20 propagates in the direction toward the second suppression electrode 242. Since the second suppression electrode 242 is grounded, it absorbs the energy of the electromagnetic waves that reaches the second suppression electrode 242. As such, the energy of the electromagnetic waves in the Z-direction is reduced, thereby presumably reducing noise in the Z-direction, so spurious emissions can be suppressed.

In the example shown in FIG. 23, the frequency difference between the frequency of the resonance point and the frequency of the anti-resonance point is greater, as compared to the example shown in FIG. 22.

The frequency difference between the frequency of the resonance point and the frequency of the anti-resonance point tends to be proportional to the electromechanical coupling coefficient K. Therefore, the electromechanical coupling coefficient K in the example shown in FIG. 23 is greater than that in the example shown in FIG. 22. This means that, the bulk wave resonator 210 of the fourth embodiment can further improve the electromechanical coupling coefficient K in addition to the suppression of spurious emissions.

As described above, in the bulk wave resonator 210 of the fourth embodiment, the first suppression electrode 240 and the second suppression electrode 242 are arranged to face each other in order to have the gap between the first electrode 18 and the second electrode 20 interposed therebetween. Therefore, according to the bulk wave resonator 210 of the fourth embodiment, it is capable of suppressing spurious emissions caused by electromagnetic waves leaking from between the first electrode 18 and the second electrode 20 and improving the electromechanical coefficient.

Furthermore, other than the first suppression electrode 240 and the second suppression electrode 242, the rest of the components of the bulk wave resonator 210 of the fourth embodiment are to the same as those of the first embodiment, so higher resonant frequency can also be set, as with the first embodiment.

It is noted that the fourth embodiment shows an example where, by providing the first suppression electrode 240 and the second suppression electrode 242, spurious emissions in the third harmonic can be suppressed; however, the first suppression electrode 240 and the second suppression electrode 242 may also be provided to suppress spurious emissions in the fundamental wave or in any higher harmonic that is equal to or higher than the fifth harmonic.

In the fourth embodiment, there is an example in which the first suppression electrode 240 and the second suppression electrode 242 are provided while the first load 130 and the second load 132 are not provided; however, the fourth embodiment may be combined with the third embodiment simultaneously provide the first suppression electrode 240 and the second suppression electrode 242 as well as the first load 130 and the second load 132.

Fifth Embodiment

Figure 24:
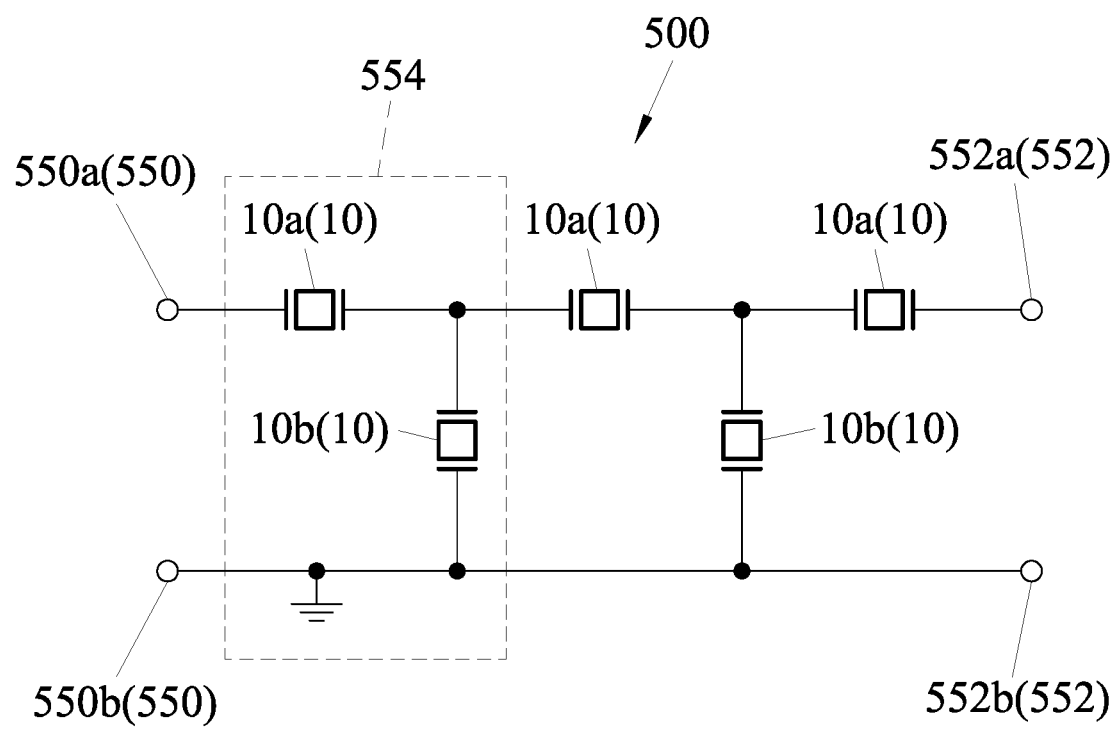
FIG. 24 is a circuit diagram of an example of a bandpass filter that includes a plurality of the bulk wave resonators of the first embodiment.

A bandpass filter constituted by a plurality of the bulk wave resonator of the above-mentioned embodiments will be described below. FIG. 24 is a circuit diagram showing an example of a bandpass filter 500 that includes a plurality of the bulk wave resonators 10 of the first embodiment. In FIG. 24, the bandpass filter 500 is shown to include a plurality of the bulk wave resonators 10 connected to each other in a so-called ladder type.

As shown in FIG. 24, the bandpass filter 500 includes a first bulk wave resonator 10a, a second bulk wave resonator 10b, a first input terminal 550a, a second input terminal 550b, a first output terminal 552a, and a second output terminal 552b. For example, the bandpass filter 500 includes three of the first bulk wave resonators 10a and two of the second bulk wave resonators 10b.

The basic configuration of each of the first bulk wave resonators 10a and the second bulk wave resonators 10b is similar to that of the bulk wave resonator 10 of the first embodiment. Therefore, each of the first bulk wave resonators 10a and the second bulk wave resonators 10b is sometimes generally referred to as the bulk wave resonator 10.

The resonant frequency of each of the first bulk wave resonators 10a is a predetermined first resonant frequency. On the other hand, the resonant frequency of each of the second bulk wave resonators 10b is a predetermined second resonant frequency. The second resonant frequency is different from the first resonant frequency. For example, the second resonant frequency may be shifted from the first resonant frequency by making the thickness of the piezoelectric layer 16 of each second bulk wave resonator 10b different from that of the piezoelectric layer 16 of each first bulk wave resonator 10a.

The first bulk wave resonators 10a are connected in series between the first input terminal 550a and the first output terminal 552a. Accordingly, the first bulk wave resonators 10a serve as series elements (series resonators) in the bandpass filter 500. The second input terminal 550b and the second output terminal 552b are grounded. In the description below, each of the first input terminal 550a and the second input terminal 550b is sometimes generally referred to as an input terminal 550, and each of the first output terminal 552a and the second output terminal 552b is sometimes generally referred to as an output terminal 552.

The second bulk wave resonators 10b are connected in parallel to a line between the first input terminal 550a and the first output terminal 552a and to a line between the second input terminal 550b and the second output terminal 552b (the input terminal 550 and the output terminal 552). Accordingly, the second bulk wave resonators 10b serve as parallel elements (parallel resonators) in the bandpass filter 500. Specifically, one end of each second bulk wave resonator 10b (one of the first electrode 18 and the second electrode 20) is connected to one of connection nodes between the first bulk wave resonators 10a. In other words, one end of each second bulk wave resonator 10b is connected to the first input terminal 550a of the input terminals 550 or the first output terminal 552a of the output terminals 552. The other end of each second bulk wave resonator 10b (i.e., the other one of the first electrode 18 and the second electrode 20) is connected to the second input terminal 550b and the second output terminal 552b. Thus, the other end of each second bulk wave resonator 10b is grounded.

As shown by the dashed line in FIG. 24, one of the first bulk wave resonators 10a and one of the second bulk wave resonators 10b form a section 554. The bandpass filter 500 may at least include one section 554. In other words, the number of the first bulk wave resonator 10a is not limited to three, but may be one, two, or four or more. The number of the second bulk wave resonator 10b is not limited to two, but may be one, or three or more.

An input voltage is applied between the input terminals 550 of the bandpass filter 500. The bandpass filter 500 allows AC voltage in a predetermined frequency band which is determined by the first bulk wave resonators 10a and the second bulk wave resonators 10b to pass therethrough, and blocks the passage of AC voltage in other frequency bands. The bandpass filter 500 then outputs, from between the output terminals 552, the passed AC voltage within the predetermined frequency band.

Furthermore, in the bandpass filter 500, the second input terminal 550b and the second output terminal 552b may be omitted. In this case, the other end of each second bulk wave resonator 10b is grounded, as with the case where the bandpass filter 500 includes the second input terminal 550b and the second output terminal 552b. In this case, an AC voltage is input to the first input terminal 550a, and an AC voltage within the predetermined frequency band is output from the first output terminal 552a.

Figure 25:
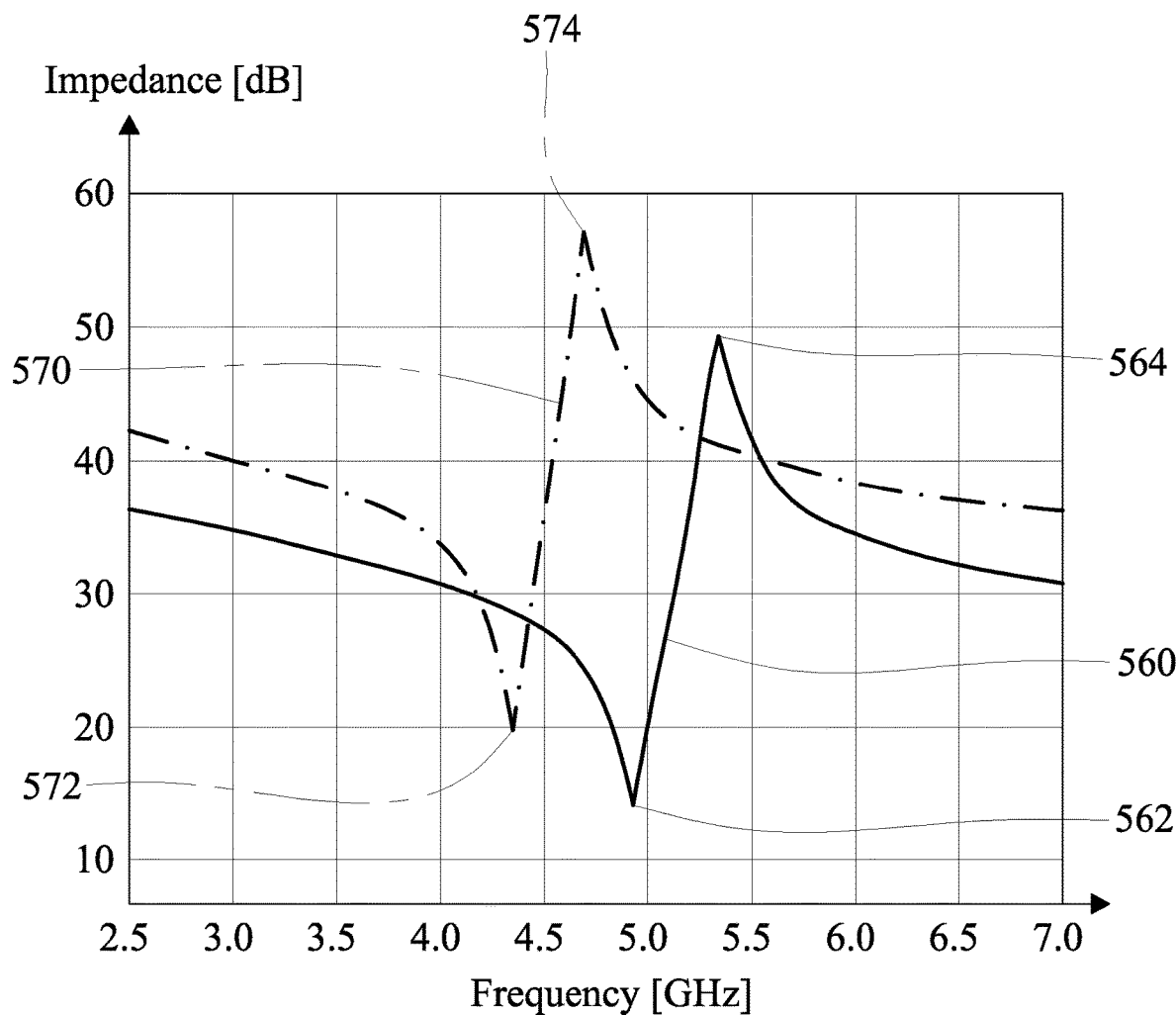
FIG. 25 shows a diagram of examples of frequency characteristic of impedance of a first bulk wave resonator and a second bulk wave resonator.

FIG. 25 shows examples of the frequency characteristic of impedance of the first bulk wave resonators 10a and the second bulk wave resonators 10b. In FIG. 25, the characteristic of the first bulk wave resonators 10a is shown by a solid line 560, and the characteristic of the second bulk wave resonators 10b is shown by a dot-dash line 570.

The first bulk wave resonators 10a of the bandpass filter 500, serving as series elements, allow a voltage at the frequency of the resonance point 562 to pass therethrough and block a voltage at the frequency of the anti-resonance point 564. On the other hand, the second bulk wave resonators 10b of the bandpass filter 500, serving as parallel elements, block a voltage at the frequency of the resonance point 572 and allow a voltage at the frequency of the anti-resonance point 574 to pass therethrough.

In the bulk wave resonator 10, the anti-resonance point appears at a relatively higher frequency than the resonance point. Therefore, in the bandpass filter 500, the resonant frequency of the first bulk wave resonator 10a that serves as a series element (the frequency of the resonant point 562) is relatively higher than that of the second bulk wave resonator 10b that serves as a parallel element (the frequency of resonant point 572). As a result, this allows the resonance point 562 of the first bulk wave resonator 10a and the anti-resonance point 574 of the second bulk wave resonator 10b to be located in the frequency range between the anti-resonance point 564 of the first bulk wave resonator 10a and the resonance point 572 of the second bulk wave resonator 10b. Accordingly, the frequency range in which a voltage is allowed to pass is demarcated by the anti-resonant point 564 of the first bulk wave resonator 10a and the resonant point 572 of the second bulk wave resonator 10b, which block the passage of the voltage.

Figure 26:
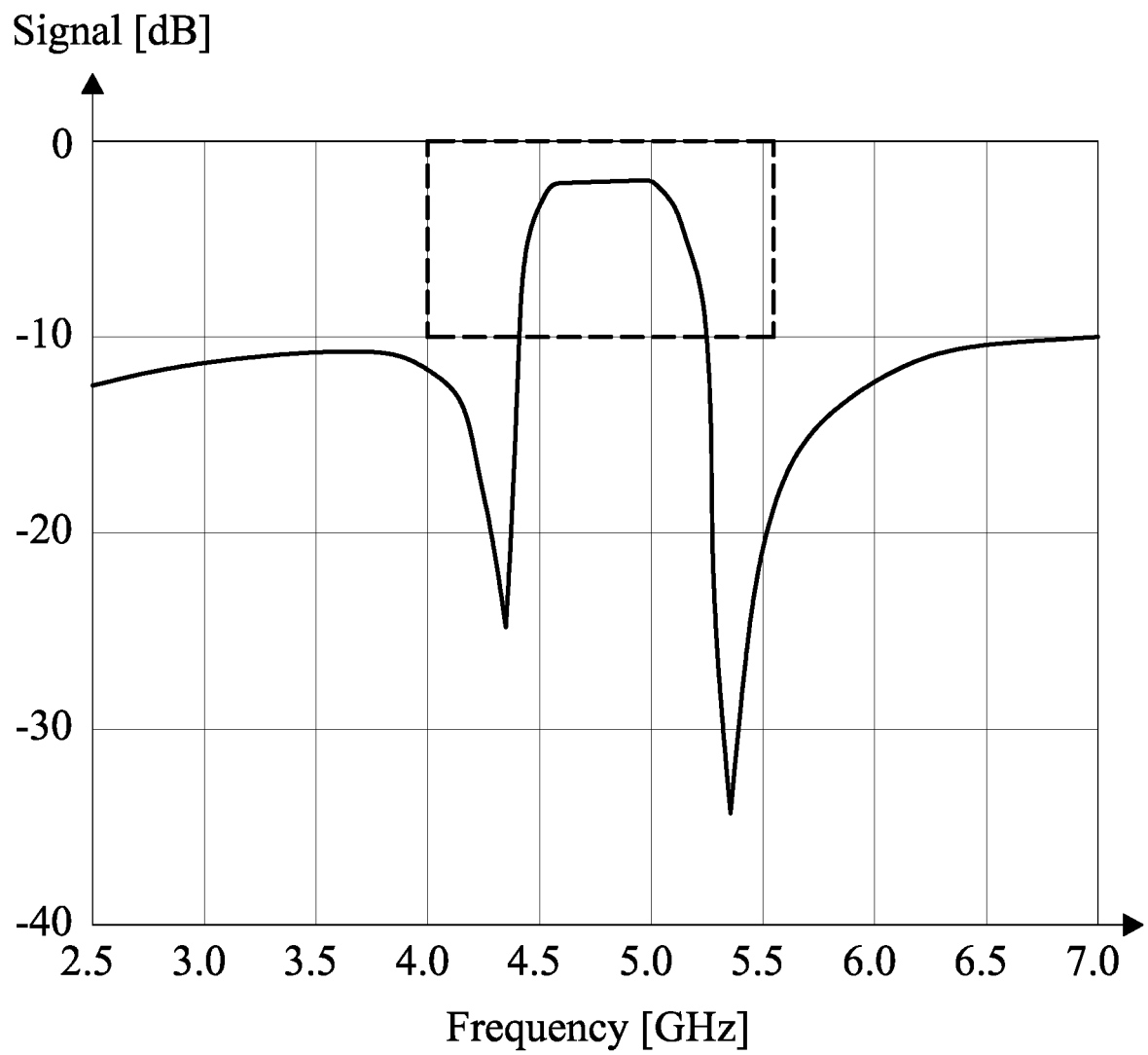
FIG. 26 shows a graph of an example of the frequency characteristic of a signal of a bandpass filter.
Figure 27:
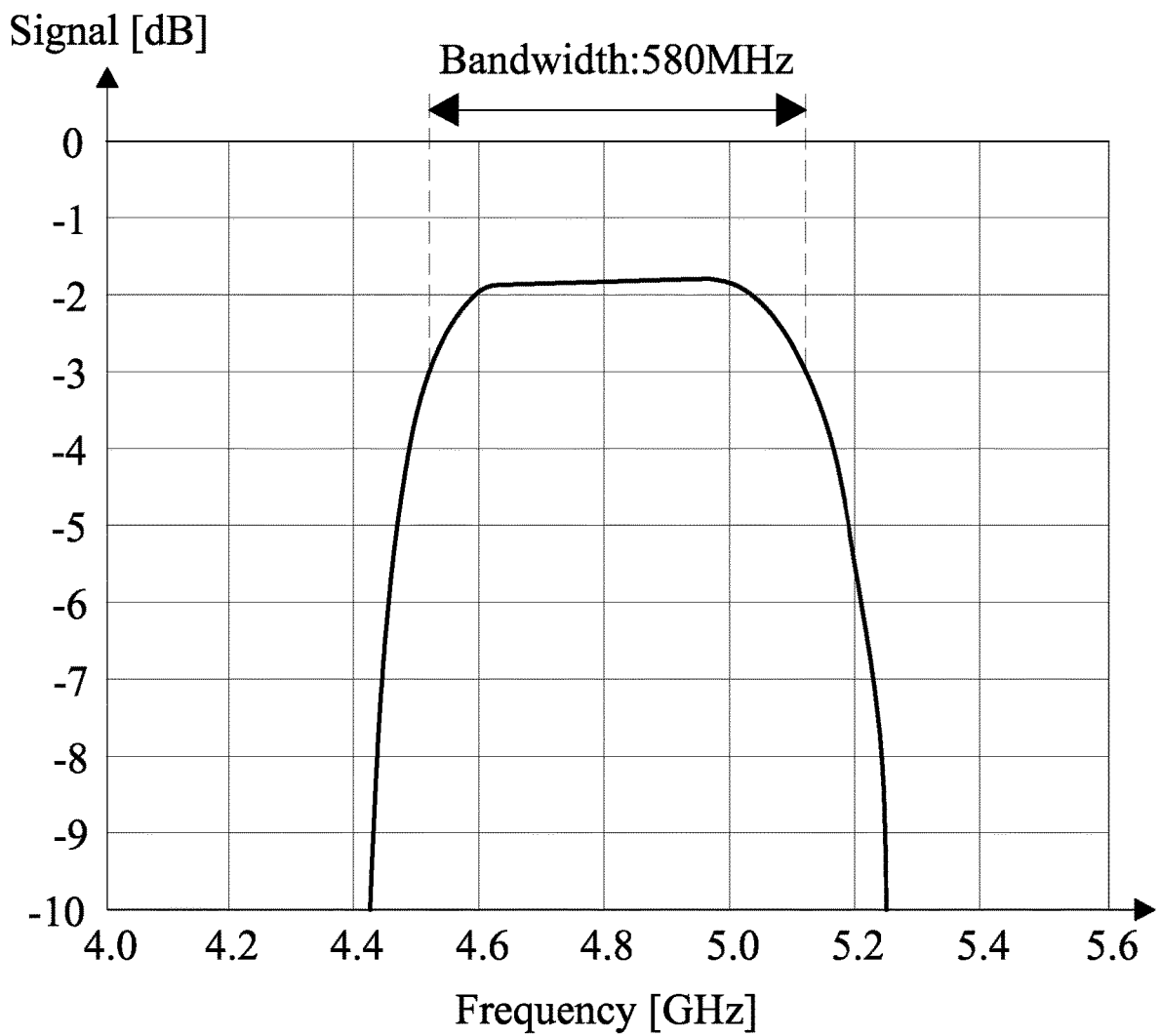
FIG. 27 is an enlarged view of the portion enclosed by the dashed line in FIG. 26.

FIG. 26 is a graph that shows an example of the frequency characteristic of the signal of the bandpass filter 500. FIG. 27 is an enlarged view of the portion enclosed by the dashed line in FIG. 26. In FIGS. 26, 27, the signal is indicated in decibels (dB) for showing an attenuation of an output signal relative to an input signal (hereinafter the attenuation may be referred to as a transmission amount).

As shown in FIG. 26, the signal attenuates significantly at about 5.3 GHz, which is the frequency of the anti-resonant point 564 of the first bulk wave resonator 10a, and at about 4.3 GHz, which is the frequency of the resonant point 572 of the second bulk wave resonator 10b. This shows that the signal is not allowed to pass at the frequency of the anti-resonant point 564 of the first bulk wave resonator 10a and at the frequency of the resonant point 572 of the second bulk wave resonator 10b.

On the other hand, the signal attenuation is relatively low at approximately 4.9 GHz, which is the frequency of the resonance point 562 of the first bulk wave resonator 10a, and at approximately 4.7 GHz, which is the frequency of the anti-resonance point 574 of the second bulk wave resonator 10b. This shows that the signal is allowed to pass adequately around the frequency of the resonance point 562 of the first bulk wave resonator 10a and around the frequency of the anti-resonance point 574 of the second bulk wave resonator 10b.

As shown in FIG. 27, for example, the bandwidth of the bandpass filter 500 can be defined as a frequency range where the signal is not less than −3 dB. That is, the bandpass filter 500 allows a signal to pass therethrough adequately when the signal has a frequency within the bandwidth and blocks passage of a signal with a frequency outside the bandwidth. The bandpass filter 500 in the example shown in FIG. 27 allows a signal within the bandwidth of from about 4.5 GHz to about 5.1 GHz to pass therethrough. The bandwidth of the bandpass filter 500 is not limited to the value shown in FIG. 27 (approximately 580 MHz), but can be designed properly based on the resonant frequencies of the first bulk wave resonator 10a and the second bulk wave resonator 10b.

As described above, the bandpass filter 500 of the fifth embodiment is configured using the bulk wave resonator 10 of the first embodiment, which can increase resonant frequency. Therefore, according to the bandpass filter 500, the passband can be set to be a higher frequency band.

In addition, the bandwidth of the bandpass filter 500 can be narrowed or widened by appropriately setting the frequency of the resonance point 562 of the first bulk wave resonators 10a and the frequency of the anti-resonance point 574 of the second bulk wave resonators 10b.

In the fifth embodiment, an example is shown where the bandpass filter 500 is configured using the bulk wave resonator 10 of the first embodiment. However, the bandpass filter 500 of the fifth embodiment may also be configured using any of the bulk wave resonators 10, 110, 210 of the first to fourth embodiments, or using bulk wave resonators which are configured according to a combination of the first to fourth embodiments. In addition, the bandpass filter 500 of the fifth embodiment may also be configured with a mixture of any of the bulk wave resonators 10, 110, 210 of the first to fourth embodiments and the bulk wave resonators configured according to an adequate combination of any of the embodiments.

Sixth Embodiment

Figure 28:
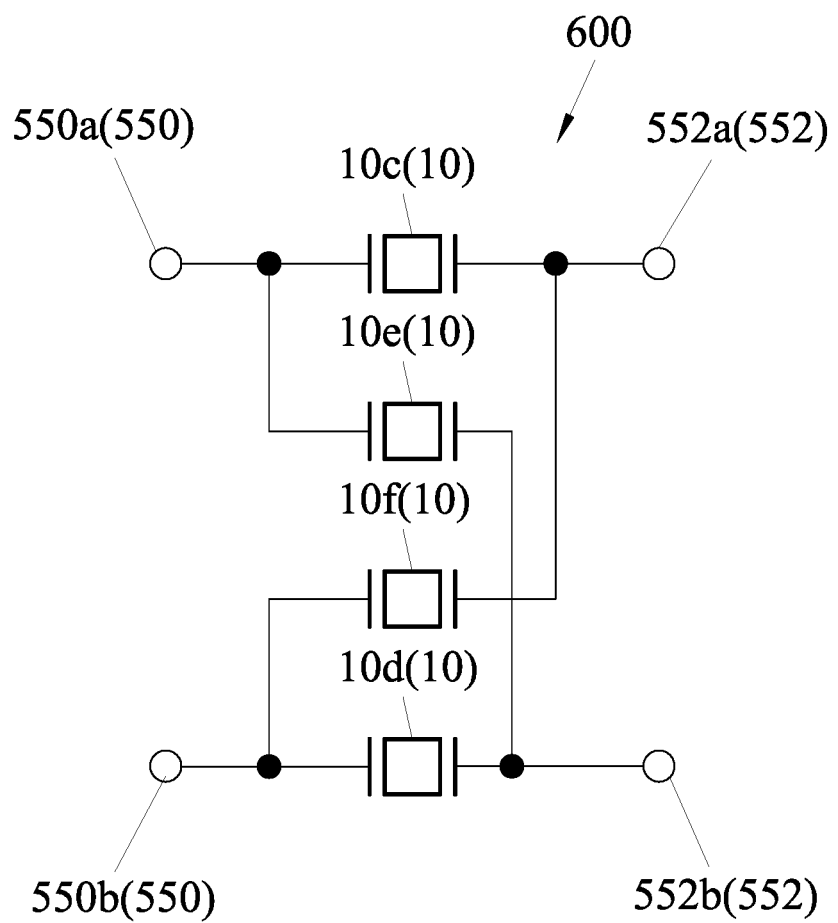
FIG. 28 is a circuit diagram showing another example of the bandpass filter that includes a plurality of the bulk wave resonators of the first embodiment.

FIG. 28 shows a circuit diagram of another example of the bandpass filter 600 that includes a plurality of the bulk wave resonators 10 of the first embodiment. In FIG. 28, the bandpass filter 600 is shown to include a plurality of the bulk wave resonators 10 connected to each other in a so-called lattice type.

As shown in FIG. 28, the bandpass filter 600 includes first bulk wave resonators 10c, 10d, second bulk wave resonators 10e, 10f, a first input terminal 550a, a second input terminal 550b, a first output terminal 552a, and a second output terminal 552b.

The basic configuration of each of the first bulk wave resonators 10c, 10d and the second bulk wave resonators 10e, 10f is the same as that of the bulk wave resonator 10 of the first embodiment. Therefore, each of the first bulk wave resonators 10c, 10d and the second bulk wave resonators 10e, 10f is sometimes generally referred to as the bulk wave resonator 10.

Like the first bulk wave resonators 10a of the fifth embodiment, each of the first bulk wave resonators 10c, 10d has a predetermined first resonant frequency. Like the second bulk wave resonators 10b of the fifth embodiment, each of the second bulk wave resonators 10e, 10f has a predetermined second resonant frequency different from the first resonant frequency.

The first bulk wave resonator 10c is connected between the first input terminal 550a and the first output terminal 552a. The first bulk wave resonator 10d is connected between the second input terminal 550b and the second output terminal 552b. Thus, the first bulk wave resonators 10c, 10d serve as series elements (series resonators) in the bandpass filter 600.

The second bulk wave resonator 10e is connected between the first input terminal 550a and the second output terminal 552b. The second bulk wave resonator 10f is connected between the second input terminal 550b and the first output terminal 552a. Thus, the second bulk wave resonators 10e, 10f serve as parallel elements (parallel resonators) in the bandpass filter 600.

Similar to the bandpass filter 500, the bandpass filter 600 can block signals around a frequency of the anti-resonance point of the first bulk wave resonators 10c, 10d and around a frequency of the resonance point of the second bulk wave resonators 10e, 10f. In addition, similar to the bandpass filter 500, the bandpass filter 600 allows signals to pass therethrough adequately around a frequency of the resonance point of the first bulk wave resonators 10c, 10d and around a frequency of the anti-resonance point of the second bulk wave resonators 10e, 10f.

As described above, similar to the bandpass filter 500, the bandpass filter 600 of the sixth embodiment can set the passband to a higher frequency band.

The bandwidth of the bandpass filter 600 can be narrowed or widened by appropriately setting the frequency of the resonance point of the first bulk wave resonators 10c, 10d and the frequency of the anti-resonance point of the second bulk wave resonators 10e, 10f.

In the sixth embodiment, an example is shown where the bandpass filter 600 is configured using the bulk wave resonator 10 of the first embodiment. However, the bandpass filter 600 of the sixth embodiment may also be configured using any of the bulk wave resonators 10, 110, 210 of the first to fourth embodiments, or using bulk wave resonators which are configured according to a combination of any of the first to fourth embodiments. In addition, the bandpass filter 600 of the sixth embodiment may also be configured with a mixture of any of the bulk wave resonators 10, 110, 210 of the first to fourth embodiments and the bulk wave resonators configured according to an adequate combination of any of the embodiments.

The embodiments of the invention are described above with reference to the accompanying drawings. It should be noted that the invention should not be limited to such embodiments. It is apparent that a person skilled in the art can conceive of various changes or modifications within the scope of the claims, which are naturally understood to be within the technical scope of the invention.

For example, the bandpass filter using any of the bulk wave resonators 10, 110, 210 of the embodiments and the variants thereof is not limited to having a ladder type circuit configuration (see FIG. 24) or a lattice type circuit configuration (see FIG. 28). Any of the bulk wave resonators 10, 110, 210 of the embodiments and variants thereof may be applied to any other circuit to configure a bandpass filter. For example, a plurality of electrodes may be arranged to be adjacent to each other on a piezoelectric plate such that the adjacent ones of the electrodes (resonators) are acoustically coupled to each other, thus forming a coupled-resonator-type filter (so-called monolithic filter).

DESCRIPTION OF REFERENCE NUMERALS

10, 110, 210 . . . bulk wave resonator
12 . . . support substrate
14 . . . acoustic multilayer film
16 . . . piezoelectric layer
16a . . . upper surface
16b . . . lower surface
18 . . . first electrode
18a, 20a, 130a, 132a . . . end face
20 . . . second electrode
130 . . . first load
132 . . . second load
240 . . . first suppression electrode
242 . . . second suppression electrode
500, 600 . . . bandpass filter

The invention claimed is:

1. A bulk wave resonator using a bulk wave, comprising:
   a support substrate;
   an acoustic multilayer film that includes, stacked on the support substrate, a plurality of types of dielectrics having different acoustic impedances;
   a piezoelectric layer that is stacked on said acoustic multilayer film; and
   a first electrode and a second electrode that are disposed to face each other with a gap therebetween on a first surface of said piezoelectric layer opposite to said acoustic multilayer film, and that are applied with a voltage for allowing said piezoelectric layer to generate the bulk wave; wherein
   a direction that is parallel to the surface of said piezoelectric layer and in which said first and second electrodes face each other being defined as a first direction, said bulk wave resonator uses, as a main mode, a bulk wave in the first direction that is generated by a thickness shear vibration in the first direction generated in said piezoelectric layer, which is excited by a parallel electric field when a voltage is applied to said first electrode and said second electrode; and wherein
   no electrode is disposed on a second surface of said piezoelectric layer that is located at the side of said acoustic multilayer film.

2. The bulk wave resonator as claimed in claim 1, wherein said bulk wave resonator is a solidity mounted resonator (SMR) type bulk wave resonator in which said piezoelectric layer is supported by said support substrate via said acoustic multilayer film, and no space is formed between said piezoelectric layer and said support substrate.

3. The bulk wave resonator as claimed in claim 1, further comprising a first load disposed on said first electrode and a second load disposed on said second electrode.

4. The bulk wave resonator as claimed in claim 3, wherein:
   said first load is disposed such that an end face of said first load that is opposite to said second electrode matches an end face of said first electrode that is opposite to said second electrode; and
   said second load is disposed such that an end face of said second load that is opposite to said first electrode matches an end face of said second electrode that is opposite to said first electrode.

5. The bulk wave resonator as claimed in claim 1, further comprising a first suppression electrode and a second suppression electrode that are disposed on said first surface of said piezoelectric layer and that are arranged to face each other in a second direction which is orthogonal to the first direction, wherein
   said first suppression electrode and said second suppression electrode are arranged to face each other in the second direction with a gap between said first electrode and said second electrode being interposed therebetween.

6. The bulk wave resonator as claimed in claim 1, wherein said first electrode and said second electrode have no portions that overlap with each other in the first direction; and
   said first electrode and said second electrode do not constitute an interdigital transducer (IDT) electrode.

7. The bulk wave resonator as claimed in claim 1, wherein said piezoelectric layer is composed of a rotated Y-cut plate that is obtained by cutting a single crystal of a piezoelectric material along a plane, said plane being obtained by rotating, at least about an X-axis, a surface of the single crystal that is orthogonal to a Y-axis.

8. The bulk wave resonator as claimed in claim 1, wherein said piezoelectric layer is composed of a rotated Y-cut plate that is obtained by cutting a single crystal of lithium tantalate along a plane, said plane being obtained by rotating, about an X-axis, a surface of the single crystal that is orthogonal to a Y-axis by an angle within a range between 80 degrees and 160 degrees, and further rotating, about a Z-axis, the rotated surface by an angle within a range between-35 degrees and 35 degrees.

9. The bulk wave resonator as claimed in claim 1, wherein said piezoelectric layer is composed of a rotated Y-cut plate that is obtained by cutting a single crystal of lithium niobate along a plane, said plane being obtained by rotating, about an X-axis, a surface of the single crystal that is orthogonal to a Y-axis by an angle within a range between 60 degrees and 170 degrees, and further rotating, about a Z-axis, the rotated surface by an angle within a range between-35 degrees and 35 degrees.

10. A bandpass filter, comprising a plurality of bulk wave resonators as claimed in claim 1.

11. The bandpass filter as claimed in claim 10, wherein a plurality of said bulk wave resonators are connected to each other in a lattice shape.

12. The bandpass filter as claimed in claim 10, wherein a plurality of said bulk wave resonators are connected to each other in a ladder shape.

13. A bulk wave resonator using a bulk wave, comprising:
a support substrate;
an acoustic multilayer film that includes, stacked on the support substrate, a plurality of types of dielectrics having different acoustic impedances;
a piezoelectric layer that is stacked on said acoustic multilayer film; and
a first electrode and a second electrode that are disposed to face each other with a gap therebetween on a first surface of said piezoelectric layer opposite to said acoustic multilayer film, and that are applied with a voltage for allowing said piezoelectric layer to generate the bulk wave; wherein
a direction that is parallel to the surface of said piezoelectric layer and in which said first and second electrodes face each other being defined as a first direction, said bulk wave resonator uses, as a main mode, a bulk wave in the first direction that is generated by a thickness shear vibration in the first direction generated in said piezoelectric layer, which is excited by a parallel electric field when a voltage is applied to said first electrode and said second electrode; and wherein
said piezoelectric layer is composed of a rotated Y-cut plate that is obtained by cutting a single crystal of lithium niobate along a plane, said plane being obtained by rotating, about an X-axis, a surface of the single crystal that is orthogonal to a Y-axis by an angle within a range between 60 degrees and 170 degrees, and further rotating, about a Z-axis, the rotated surface by an angle within a range between-35 degrees and 35 degrees.

14. A bulk wave resonator using a bulk wave, comprising:
a support substrate;
an acoustic multilayer film that includes, stacked on the support substrate, a plurality of types of dielectrics having different acoustic impedances;
a piezoelectric layer that is stacked on said acoustic multilayer film;
a first electrode and a second electrode that are disposed to face each other with a gap therebetween on a first surface of said piezoelectric layer opposite to said acoustic multilayer film, and that are applied with a voltage for allowing said piezoelectric layer to generate the bulk wave; and
a first load disposed on said first electrode and a second load disposed on said second electrode; wherein
a direction that is parallel to the surface of said piezoelectric layer and in which said first and second electrodes face each other being defined as a first direction, said bulk wave resonator uses, as a main mode, a bulk wave in the first direction that is generated by a thickness shear vibration in the first direction generated in said piezoelectric layer, which is excited by a parallel electric field when a voltage is applied to said first electrode and said second electrode.

15. A bulk wave resonator using a bulk wave, comprising:
a support substrate;
an acoustic multilayer film that includes, stacked on the support substrate, a plurality of types of dielectrics having different acoustic impedances;
a piezoelectric layer that is stacked on said acoustic multilayer film; and
a first electrode and a second electrode that are disposed to face each other with a gap therebetween on a first surface of said piezoelectric layer opposite to said acoustic multilayer film, and that are applied with a voltage for allowing said piezoelectric layer to generate the bulk wave; wherein
a direction that is parallel to the surface of said piezoelectric layer and in which said first and second electrodes face each other being defined as a first direction, said bulk wave resonator uses, as a main mode, a bulk wave in the first direction that is generated by a thickness shear vibration in the first direction generated in said piezoelectric layer, which is excited by a parallel electric field when a voltage is applied to said first electrode and said second electrode; wherein
the bulk wave resonator further comprises a first suppression electrode and a second suppression electrode that are disposed on said first surface of said piezoelectric layer and that are arranged to face each other in a second direction which is orthogonal to the first direction; and wherein
said first suppression electrode and said second suppression electrode are arranged to face each other in the second direction with a gap between said first electrode and said second electrode being interposed therebetween.

16. A bulk wave resonator using a bulk wave, comprising:
a support substrate;
an acoustic multilayer film that includes, stacked on the support substrate, a plurality of types of dielectrics having different acoustic impedances;
a piezoelectric layer that is stacked on said acoustic multilayer film; and
a first electrode and a second electrode that are disposed to face each other with a gap therebetween on a first surface of said piezoelectric layer opposite to said acoustic multilayer film, and that are applied with a voltage for allowing said piezoelectric layer to generate the bulk wave; wherein
a direction that is parallel to the surface of said piezoelectric layer and in which said first and second electrodes face each other being defined as a first direction, said bulk wave resonator uses, as a main mode, a bulk wave in the first direction that is generated by a thickness shear vibration in the first direction generated in said piezoelectric layer, which is excited by a parallel electric field when a voltage is applied to said first electrode and said second electrode; wherein said first electrode and said second electrode have no portions that overlap with each other in the first direction; and wherein said first electrode and said second electrode do not constitute an interdigital transducer (IDT) electrode.

17. A bulk wave resonator using a bulk wave, comprising:

a support substrate;

an acoustic multilayer film that includes, stacked on the support substrate, a plurality of types of dielectrics having different acoustic impedances;

a piezoelectric layer that is stacked on said acoustic multilayer film; and a first electrode and a second electrode that are disposed to face each other with a gap therebetween on a first surface of said piezoelectric layer opposite to said acoustic multilayer film, and that are applied with a voltage for allowing said piezoelectric layer to generate the bulk wave; wherein a direction that is parallel to the surface of said piezoelectric layer and in which said first and second electrodes face each other being defined as a first direction, said bulk wave resonator uses, as a main mode, a bulk wave in the first direction that is generated by a thickness shear vibration in the first direction generated in said piezoelectric layer, which is excited by a parallel electric field when a voltage is applied to said first electrode and said second electrode; and wherein said piezoelectric layer is composed of a rotated Y-cut plate that is obtained by cutting a single crystal of lithium tantalate along a plane, said plane being obtained by rotating, about an X-axis, a surface of the single crystal that is orthogonal to a Y-axis by an angle within a range between 80 degrees and 160 degrees, and further rotating, about a Z-axis, the rotated surface by an angle within a range between -35 degrees and 35 degrees.

* * * * *